United States Patent [19]

Eichelberger

[11] Patent Number: 5,250,843

[45] Date of Patent: * Oct. 5, 1993

[54] MULTICHIP INTEGRATED CIRCUIT MODULES

[75] Inventor: Charles W. Eichelberger, Schenectady, N.Y.

[73] Assignee: Integrated System Assemblies Corp., Woburn, Mass.

[*] Notice: The portion of the term of this patent subsequent to May 5, 2009 has been disclaimed.

[21] Appl. No.: 942,105

[22] Filed: Sep. 8, 1992

Related U.S. Application Data

[63] Continuation of Ser. No. 676,937, Mar. 27, 1991, abandoned.

[51] Int. Cl.$^5$ ............... H01L 23/48; H01L 29/46; H01L 29/54
[52] U.S. Cl. .................... 257/692; 257/693; 257/687
[58] Field of Search ........... 357/74, 75, 80, 81; 174/52.2, 52.4; 257/692, 693, 687

[56] References Cited

U.S. PATENT DOCUMENTS

| | | | |
|---|---|---|---|
| 4,630,096 | 12/1986 | Drye et al. | 357/81 |
| 4,714,516 | 12/1987 | Eichelberger et al. | 156/628 |
| 4,783,695 | 11/1988 | Eichelberger et al. | 357/65 |
| 4,827,328 | 5/1989 | Ozawa et al. | 357/80 |
| 4,835,704 | 5/1989 | Eichelberger et al. | 364/490 |
| 4,860,166 | 8/1989 | Nicholls | 361/414 |
| 4,866,508 | 9/1989 | Eichelberger et al. | 357/74 |
| 4,878,991 | 11/1989 | Eichelberger et al. | 156/630 |
| 4,884,122 | 11/1989 | Eichelberger et al. | 357/71 |
| 4,894,115 | 1/1990 | Eichelberger et al. | 156/643 |
| 4,901,136 | 2/1990 | Neugebauer et al. | 357/75 |
| 4,907,062 | 3/1990 | Fukushima | 357/75 |
| 4,918,811 | 4/1990 | Eichelberger et al. | 29/840 |
| 4,933,042 | 6/1990 | Eichelberger et al. | 156/239 |
| 5,049,980 | 9/1991 | Saito et al. | 357/80 |
| 5,065,282 | 11/1991 | Polonio | 361/399 |
| 5,091,769 | 2/1992 | Eichelberger | 357/72 |
| 5,111,278 | 5/1992 | Eichelberger | 357/75 |

FOREIGN PATENT DOCUMENTS

| | | | |
|---|---|---|---|
| 61-42159 | 2/1986 | Japan | 357/75 |
| 62-122258 | 6/1987 | Japan | 357/75 |
| 63-293965 | 11/1988 | Japan | 357/81 |

OTHER PUBLICATIONS

The STD-Process-New Developments and Applications, Clark et al. pp. 131-144, 1974, International Microwave Symposium.

Levinson et al., High Density Interconnects Using Laser Lithography, Proceed. of ISHM, Seattle, pp. 1-4, Oct. 1988.

Primary Examiner—Jerome Jackson
Assistant Examiner—D. Monin
Attorney, Agent, or Firm—Heslin & Rothenberg

[57] ABSTRACT

A multichip integrated circuit package comprises a substrate having a flat upper surface to which is affixed one or more integrated circuit chips having interconnection pads. A polymer encapsulant completely surrounds the integrated circuit chips. The encapsulant is provided with a plurality of via openings therein to accommodate a layer of interconnection metallization. The metallization serves to connect various chips and chip pads with the interconnection pads disposed on the chips. In specific embodiments, the module is constructed to be repairable, have high I/O capability with optimal heat removal, have optimized speed, be capable of incorporating an assortment of components of various thicknesses and function, and be hermetically sealed with a high I/O count. Specific processing methods for each of the various module features are described herein, along with additional structural enhancements.

54 Claims, 17 Drawing Sheets

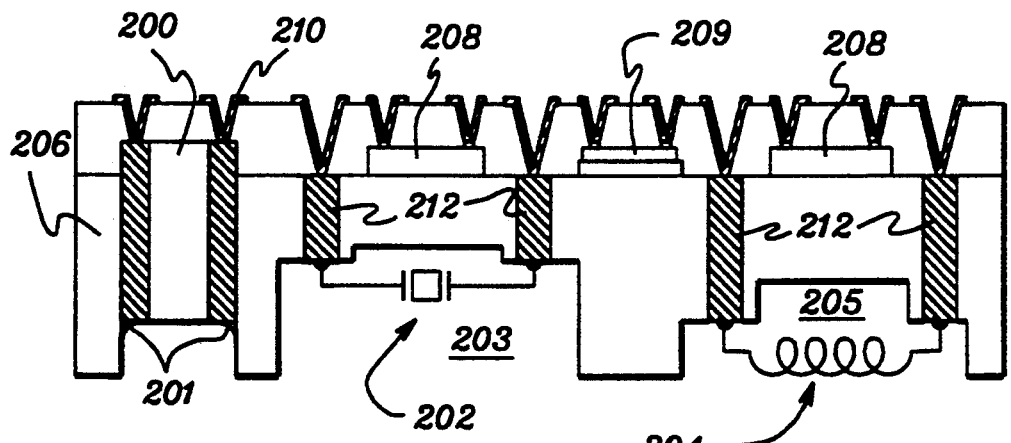
fig. 16
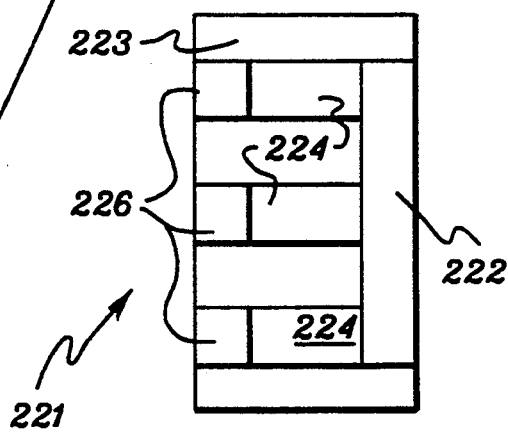
fig. 17b
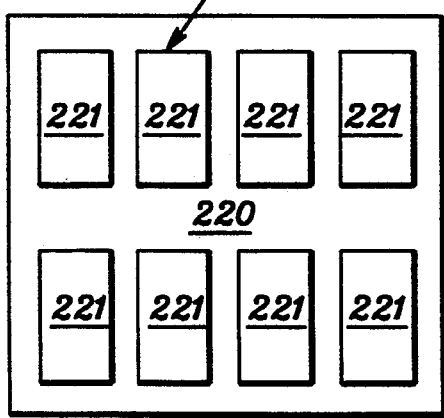
fig. 17a
fig. 17c

MULTICHIP INTEGRATED CIRCUIT MODULES

This application is a continuation of application Ser. No. 07/676,937, filed Mar. 27, 1991 now abandoned.

BACKGROUND OF THE INVENTION

1. Technical Field

The present invention is generally directed to an improved multichip integrated circuit module. More particularly, the present invention relates to a packaging method for electronic integrated circuit chips, particularly very large scale integrated circuit (VLSI) devices, on a substrate also having a polymer encapsulant overlying the chips on the substrate and providing a means for supporting inter chip and intra chip connection conductors. Even more particularly, the present invention relates to a repairable multichip module structure and corresponding repair method; a multichip module structure having high I/O capacity with optimal heat removal through one side and high performance I/O through an opposite side; multichip module structures optimized for speed; multichip module structures having the ability to incorporate an assortment of components of varying thickness and function therein; and multichip modules having an integrated hermetic structure with high I/O count.

2. Description of the Prior Art

Multichip modules are divided into two basic structures. In the most common structure, a miniature circuit board is provided upon which integrated circuits are mounted and electrically connected. The second multichip module structure involves mounting chips on a substrate, and subsequently providing interconnect to the chips by essentially building an interconnecting circuit board over the top of the chips. These two approaches are referred to herein as "chip on board" for the first approach, and "circuit board above chips" for the second approach.

In the "chip on board" approach, the circuit board is typically fabricated using alumina or silicon substrate, with copper or aluminum interconnection metallization. The most frequently used dielectric is polyimide. Silicon dioxide can be used as a dielectric on silicon substrates with certain thermal advantages. There are three primary methods for making connection from the pads of the chips to the miniature circuit board. These are wire bonding, tape automated bonding or tab bonding, and flip chip or solder bump bonding. Each of these approaches, including their advantages and disadvantages, are discussed below.

There are two know prior art approaches for the "circuit board above chips" technique. These approaches are the Semiconductor Thermoplastic Dielectric (STD) process and the High Density Interconnect (HDI) overlay process. In the STD process chips are mounted on a substrate and a thermoplastic dielectric is pressed over the chips at high temperature and pressure such that it fills the gaps between the chips and leaves a dielectric over the tops of the chips. Interconnection in this approach is achieved by: forming via holes in the dielectric to the pads of the chips; subsequently metallizing the entire surface; and patterning the metal to form the interconnect. The HDI overlay approach distinguishes over the STD approach in that chips are placed on a substrate and subsequently a polymer overlay is adhered over the tops of the chips. This overlay bridges the gaps between the chips. Again interconnection is provided by forming via holes in the polymer dielectric, metallizing the entire surface of the overlay and pattering the metal to form the interconnect. A discussion of the HDI overlay approach is provided by Eichelberger et al. in U.S. Pat. No. 4,783,695, entitled "Multichip Integrated Circuit Packaging Configuration and Method," and U.S. Pat. No. 4,918,811, entitled "Multichip Integrated Circuit Packaging Method." The subject invention falls into the category of "circuit board above chips" and most closely resembles the STD approach.

Depending on the application and on the choice of multichip module technique, there are a series of problems associated with interconnect of electronic components which are solved with varying degrees of success. The rest of this section discusses these problems in terms of the solution provided by each of the basic prior art multichip module technologies. The problems discussed include heat removal, interconnect density, high frequency performance, alignment of chips or interconnect to the circuit board, reliability, ease of manufacture, interconnection to the next level, capability of repair, substrate choice and hermeticity.

Heat Removal

"Chip on board" technology is at a disadvantage for heat removal because the interlayer dielectric used to separate the conductor layers is also a good thermal insulator. This is true of polyimide and to a somewhat lesser extent of silicon dioxide. Since the chips are mounted on the board, heat must be removed through the dielectric layer which as noted, presents a considerable thermal resistance. "Circuit board above chips" technology is inherently better for heat removal since the chips are mounted directly on the substrate. In this case, the only thermal resistance encountered is due to the material that the chip is made of, the die attach material and the thickness of the substrate. (As noted below, pursuant to the subject invention chips are thinned to approximately one-third their original thickness. This is to reduce the thermal resistance due to the chip material, and is especially important when using GaAs as a chip material since GaAs is a reasonably poor thermal conductor. Note also that the die attach material can be applied in the subject invention by either spin or spray techniques, which allows a very thin glue line to be formed. The reduced material thickness contributes directly to reduced thermal resistance in the adhesive.)

Interconnect Density

In many applications it is desireable to achieve the greatest amount of interconnected electronics in the smallest amount of space. In the multichip modules several factors limit the ability to interconnect ICs which are separated by vary small spacings. The factors which limit the spacings between chips are different depending on the approach. In the "chip on board" approach, space must be provided between chips to allow interconnection from the pads of chips to the pads of the circuit board. Typical required spacings are 50 mils for wire bonding from a chip pad to a pad of the circuit board. This means that each chip requires a picture frame of 50 mils around the chip before additional chips can be placed. Tape automated bonding also requires substantial space on the same order of 50 to 100 mils, for bonding from the pads of the chip to the pads of the circuit board. Flip chips or solder bump involves connecting chips with small balls of solder between the pads of the chip and the pads of the circuit board. This technique can allow very close spacing between adjacent chips since, in principle, there is no area required around the periphery of the chip in order to make the interconnect. It should be noted that the flip chip bonding approach is not without substantial disadvantages. First, the chips are rigidly connected to the circuit board by the solder bumps such that differential thermal expansion produces extreme stresses on the chip and the solder bump interconnect. In addition, thermal performance of this structure is poor because the solder bumps do not provide thermal conductivity to the circuit board and the back of the chip is not thermally connected to anything. In certain systems thermal pistons have been provided for heat removal in this structure.

The "circuit board above chips" approach is inherently capable of higher density interconnect in that chips are interconnected within their own periphery. The overlay approach, which utilizes adaptive lithography, suffers somewhat because adaption moats must be provided around each chip in order to accommodate any slight mispositioning of the chips during the die attach process.

A second factor limiting achievable interconnect density is the resolution of the interconnect patterning. The major effect limiting the patterning resolution is the planarity of the interconnect surface. "Chip on board" circuits are fabricated on flat substrates and interconnect planarity is no factor. With the "circuit board above chip" approach, interconnect planarity is an issue. For example, in the overlay approach there are substantial dips between adjacent chips depending on the separation between the chips. This problem is further exacerbated by certain combinations of large and small chips. The result is typically a surface for interconnect patterning which has two to four mil nonplanarity. Contact masking techniques as well as low F number imaging techniques suffer degraded performance in resolution with this level of nonplanarity. (It should be noted that the subject invention is specifically distinguished by a highly planar interconnect surface.)

High Frequency High Speed Performance

All of the multichip module structures described thus far are capable of delivering good high speed performance up to 100 to 200 megahertz clock frequency. When frequencies exceed 200 megahertz, however, special processing techniques must be incorporated to insure optimum operation at the highest frequency. In all cases, impedance controls are necessary and terminating resistors are required. The "circuit board above chip" approach has an advantage at high speeds because the controlled impedance interconnect can be provided all the way to the chip pad. In the "chip on board" approach, a discontinuity is inserted when making the connection from the circuit board to the pad of the chip. This discontinuity results from using wire bond or TAB bonding techniques. The use of flip chip bonding substantially reduces the discontinuity, but suffers from the thermal problems previously mentioned. At high speeds thermal dissipation is essentially a given. In addition, the highest speed circuits are fabricated using GaAs. Matching a substrate to the GaAs expansion coefficient is very difficult especially in systems which mix silicon and GaAs. As a result, severe thermal stresses are encountered in solder bump approaches for high speed circuits.

(It should be noted that the subject invention offers specific advantages at high speed because of the highly planar surface. The interconnect resolution results in very close control of line width and therefore close control of characteristic impedance. In addition, prefabricated terminating resistors can be placed between adjacent chips with very little impact on chip to chip spacing. In the subject invention, optimized for high speed, a power delivery system is provided which features direct connection from the power ground plane to the pads of the chip. The space between power and ground is minimized for low inductance and high dielectric constant dielectric material is used to give high capacitance between power and ground.)

Alignment of Chips for Interconnect To Circuit Board

It is necessary to place the chips with sufficient accuracy that, whatever method of interconnect from the chips to the circuit board, the interconnect will land properly both on the pads of the chip and on the interconnect circuitry. In the "chip on board" approach, chips can be die attached with poor alignment. For wire bonding, manual or automatic wire bonding techniques are used which identify the position of the chips and adjust the wire bonding operation to accommodate mispositioning of the chip. In TAB bonding, the mispositioning of the chips is accommodated by the fan out of the tab interconnect. A typical fan out to 10 mils center can accommodate several mils of mispositioning. It should be noted, however, that fan out results in a larger footprint surrounding each chip and therefore reduced interconnect density.

In the overlay approach using adaptive lithography, chip misplacement is accommodated by identifying the position of each chip and adjusting the artwork for each module to accommodate the actual positioning of the chips in that module. This approach requires a computer driven laser scanning system for painting the artwork patterns. In the STD approach, chip alignment is achieved by providing indentations in the substrate which serve as alignment guides to which two edges of a chip can be registered and thereby maintain alignment. This technique is unsatisfactory for todays commercially available chips because the saw cut cannot be guaranteed to be within plus or minus 2 mils and therefore, since chip pads in some circuits are 3 mils, severe misregistration between chip pads and artwork can result. In addition, it is extremely difficult to provide highly accurate registration indentation in the most desirable substrates, namely, alumina and aluminum nitride. A further problem associated with alignment of chips is that notwithstanding the accurate placement of chips, they often move or swim during subsequent curing of the die attach material. Further, commercially available die attach equipment can result in an overall misplacement of die on the order of 4 to 10 mils. This degree of mispositioning is acceptable in most "chip on board" approaches and in approaches using adaptive lithography. However, it is not acceptable in "circuit board above chip" approaches which do not use adaptive lithography. (As explained below, the subject invention provides a means for both highly accurate positioning of the chips and a means to prevent the chips from swimming on subsequent cure such that die positioning accuracies of 6 to 8 microns are routinely achieved.)

Flip chip or solder bump bonding systems achieve alignment due to the surface tension associated with the melted solder ball. It is only necessary to place the chip and solder ball within several mils of the final position and surface tension will draw the chip into accurate alignment with the chip pads below.

In addition to XY and rotation alignment, chips must also have their height or Z-axis alignment controlled when used in the "circuit board above chip" configuration. In the overlay approach, this Z-axis height control is achieved by milling the substrate to depths which allow the top surface of the chips to be substantially planar. Because chips from the same lot are not all the same thickness, this requires either custom producing each milled substrate or allowing a reasonably high degree of tolerance on the order of plus or minus several mils for chip height variation. In the STD process, a unique technique is used for controlling the variation in chip height. In this technique, chips are placed on a substrate of aluminum and subsequently swaged under high pressure until the corresponding deformation of the aluminum sets all chips at the same height. Today, chips with sub- micron geometries could not undergo the severe stresses involved. In addition, thicknesses of today's chips vary from 10 mils to 30 mils depending on the size of the wafer on which they are fabricated. Finally, the expansion coefficient of aluminum is not well matched to silicon. Chips of substantial size, such as 200 mils on a side or more, can be broken by the differential expansion. Obviously, the technique would not work using alumina or aluminum nitride or even silicon since these materials cannot be deformed. (In the subject invention, a method is disclosed for thinning chips to an extremely well controlled thickness such that all chips can be mounted on a perfectly flat substrate with the result that the top surfaces of all the chips are extremely planar. This technique allows the use of commercially available chips with substantial differences in thickness.)

Reliability

It is possible to provide highly reliable interconnect in any of the prior art technologies by properly selecting materials and processes used. The main sources of unreliability relate to the method of interconnecting the chips to the circuit board. "Chip on board" technologies must make a connection from the chip to the circuit board which is different than the technologies used for interconnecting on the board itself. Specifically wire, flip chip and tab bonding all have interconnect reliabilities which are at least an order of magnitude lower than the interconnect technique used in the integrated circuits themselves. The "circuit board above chip" technique uses the same technology as that used to fabricate the integrated circuits themselves. Specifically, via holes are formed to the pads of the chips and metallization is applied by vacuum sputtering techniques preceded by an RF sputter cleaning step. This results in a vacuum pure metallization which is free from contaminants and which is highly reliable.

Another reliability limiting factor in multichip modules is the ability of the module to withstand significant thermal stresses. "Chip on board" suffers from thermal stresses at the interface between the chip and the circuit board. Flip chip/solder bump bonding encounters the greatest stress in the solder bump interconnect with no appropriate way to relieve that stress. With "circuit broad above chip" approaches, the HDI overlay approach enjoys significant advantages in that the bridging structure provides an expansion joint for relieving stress between each chip. However, it does subject the chips to high stresses during the manufacturing process and, specifically, to the overlay layer which is adhesively bonded using high pressure and high temperature. This subjects chips to stresses which can break the very fine interconnect wiring and to subtle motion under pressure which in the presence of contaminants can cut chip wiring. The STD process is also conducted using high temperature and high pressures and subjects the chips to the same kind of stresses and potential for damage from contaminants. Further, the STD process is vulnerable to stress buildup in the polymer surrounding the chips due to significant thickness of this polymer. Physically this occurs because the thickness of the polymer fails to communicate the expansion coefficient of the substrate to the top of the polymer. As a result, at the top of the polymer there is a significant stress buildup which tends to crack the polymer at the surface. (By comparison, in the subject invention, there is no pressure and relatively low temperature during the process of applying the polymer dielectric layers. In addition, chips are specifically thinned to thicknesses on the order of 6 to 8 mils so that any stress buildup in the polymer is controlled by relative proximity thereof to the substrate.)

Ease of Manufacture

In the "chip on board" approach, manufacturing of the circuit board is relatively easy because the circuit board is generally planar in structure. This aids in manufacture by simplifying the lithography steps. Most manufacturing difficulties with the "chip on board" approach stem from the need to attach and interconnect the chips to the board after it has been fabricated. Wire bonding is a serial process and requires a bond to be formed on the chip and on the board for each interconnect. This is time consuming and suffers increased difficulty as the number of interconnects per chip is increased. Tab bonding can be a gang process but reliable processing of the large number of connections using a gang contact approach has not been demonstrated. Solder bump connection can make all interconnections at the same time but it requires special processing of the chips. Commercially available chips are generally not available with solder bumps. This rules out the use of commercially available chips in conjunction with the solder bump process.

In the "circuit board above chip" approach, interconnect to the chip is formed at the same time that the first layer of the circuit board is processed. In this type of approach the manufacturing difficulty is primarily due to a nonplanar interconnect surface. As stated earlier, the HDI overlay approach results in a nonplanar surface which increases the difficulty of lithography. (The subject invention specifically discloses a method for planarizing the interconnect surface. This method is readily manufacturable and is amenable to a variety of encapsulant material which can either be thermoplastic or thermal set.)

Capability for Repair

Most multichip modules can be repaired by some means. "Chip on board" modules are repaired by different methods depending on the method of chip interconnection. In the case of wire bonds, the wire bonds are first broken and the residual wire bond tails are removed as close as possible to the surface of the circuit board. The integrated circuits are then removed and a new integrated circuit is mounted in place. The wire bonding of the new integrated circuit must take place in area where wire bonds have not previously been. This requires that larger areas be set aside for circuits which are expected to require repair. Tab bonded circuits cannot be repaired if welding techniques for connecting the tab to the circuit board are used. If solder techniques are used, the solder can be reheated and the tab removed. Replacing the IC with a new IC requires careful preprocessing of the tab interconnect area before it is ready to accept a new tab interconnect. This problem is compounded as the number of interconnects to the chip is increased. With the flip chip bonding approach, the chip can be heated and removed when the temperature exceeds the melting point of the solder bumps. Again, it is necessary to carefully process each interconnect position before a new chip can be added. A danger associated with "chip on board" repair is that the circuit board will be damaged during the repair process. If this occurs, the chips which are on that board are lost because they cannot be removed and used in another board without damage to the chips. In systems where the chips are a very substantial portion of the total cost of the assembly, this is a severe problem.

In the "circuit board above chip" approach, the STD structure cannot be repaired. The overlay structure is repaired by peeling the overlay from the chips thus breaking all of the interconnections between the circuit board and the chips. Cleanup steps are used to remove the residuals of those interconnects and then the bad chip is replaced. Once a chip has been replaced, a new overlay is laminated and the process repeated. While this process does impose some stress on the module due to the peeling operation and repeated high temperature and pressure laminations, it has been reported to allow more than ten repairs of the same circuitry. The process can also be used to repair the circuit board portion of the interconnect. With "chip on board," if the circuit board portion is not perfect when the chips are mounted, then it forces the entire assembly to be discarded when the board is bad. With the HDI overlay approach, the circuit board portion can be removed and rebuilt over the chips.

(In the subject invention, methods are disclosed for repairing of the assembly which do not require any additional space to accommodate the possibility that the circuit will need repair. Repairs can be made to the circuits a large number of times without risk that the entire assembly will have to be discarded. In addition, in one embodiment of the invention, the circuit board portion of the circuit can be repaired without exposing the chips to any contact whatsoever.)

Substrate Choice

Many of the prior art multichip module approaches have been limited in the choice of substrates available. Special applications may require a choice of substrate which precludes the use of a given multichip module technique. The flip chip bonding approach limits the substrate to a substrate which has extremely good thermal match to the chips. When large chips are used this limits the substrate to silicon since this is the only material which has a sufficiently good thermal expansion coefficient match. GaAs circuits of any reasonable size cannot be accommodated by the same substrate that uses silicon circuits. Tab bonded circuits and wire bonded circuits require substrates which can accommodate the bonding operations. For example, in tab bonding the substrate must have a melting point which is higher than the solder melting point of the tab bonding. In wire bonding the substrate must be sufficiently rigid that the ultrasonic wire bonding operation can take place. In "circuit board above chip" approaches, the substrate choices are limited depending on the exact approach. With the overlay approach, the substrate must be chosen from a material which can be machined to accommodate the different heights of the chips. Specifically, this precludes the use of very high thermal conductors such as copper-molybdenum-copper sandwiches since portions of the sandwich must be cut away to accommodate the differing chip heights. This eliminates the balance of the thermal expansion forces and leaves behind a bimetallic strip which changes shape with changes in temperature. Substrate choices in the STD process are severely limited due to the requirement of swaging chips to achieve planarity. (In the subject invention, chips are placed on a completely flat substrate with the chips thinned to achieve planarity. As such, all substrates mentioned as candidates for any of the other multichip module technologies can be used with the subject invention with a minimum of substrate processing.)

Hermeticity

Many applications require that the chips and the interconnect be placed in a hermetic enclosure such that the effects of moisture do not impact the chips or interconnect. The conventional approach to providing a hermetic assembly is to place the finished multichip module in a hermetic package and then interconnect pads on the multichip module to pins on the package. This approach limits the total number of input/output lines that can be accommodated. For example, in a 2 " by 2" module with pin spacing as small as 25 mils, the total number of possible pins is 80 per side or 320 pins. This still leaves a very difficult problem in attaching this package to a circuit board. In addition, such packages are very expensive, often equalling the cost of the multichip module itself. Placing the module in a pin grid array can increase the number of pins available. A 2" by 2" package even with pin spacing of 0.1" will result in a total number of pins of 400. Reducing the pin to pin spacing will dramatically increase the number of I/O pins available. The problem with such an approach is that the surface which is available for heat removal is the same surface that the pins come out of; that is, the multichip module is placed in the pin grid array such that the backside or heat removal side contacts the side of the pin grid array which houses the pins. The only side of the pin grid array which is available for heat sink is the side without the pins. However, that side makes no thermal contact to the multichip module.

(The subject invention discloses two structures for achieving a hermetically packaged module in which very large numbers of I/O pins can be accommodated and in which the heat is removed through the surface which does not contain the input output lines. In one of these structures, the hermetic package is achieved as an integral part of the module processing so that there is no requirement for a separate package. In addition, the multichip module processing is conducted in exactly the same manner except for additional steps at the end of the process to add the hermetic features.)

Interconnection to the Next Level

To make use of the multichip module in a system it is necessary to interconnect from the multichip module to a printed circuit board or other carrier for the multichip module. This has been done conventionally by putting the multichip module in a package and wire bonding the multichip module pads to pins of the package. Subsequently the package is mounted on a circuit board and soldered in place by through hole techniques or surface mount techniques. As stated before, such packages have the disadvantage of high cost and a limited number of pins in the system. In addition, once soldered in place it is extremely difficult to remove a high pin count package without damage to the circuit board. (According to the subject invention several alternative structures are disclosed which allow for novel interconnect from the multichip module to the next interconnect level. These structures are integral to the multichip module itself and eliminate the requirement for a separate package. The structures include an area pad array coupled with button contacts, integral TAB connections and the incorporation of novel I/O devices on the periphery of the fabricated multichip module.)

Testability

It is extremely difficult to test a completed multichip module because the module functions are complex and it is difficult to make interconnection to internal nodes of the multichip module. This is especially true of the "chip on board" type multichip module where a high portion of the circuitry is covered by the IC chips themselves and therefore unavailable for probing. (In the subject invention, the entire surface area of the multichip module is covered with an array of pads which make connection to internal nodes of the module. This dramatically improves the observability of the internal operation of the module and allows for stimulation of those internal nodes by the use of overdrive approaches.)

SUMMARY OF THE INVENTION

In accordance with a preferred embodiment of the present invention, a multichip integrated circuit package comprises a substrate and a plurality of integrated circuit chips disposed on the substrate. The chips include interconnection pads for connecting to other integrated circuit components or for connecting to other pads of the same chip. A polymer encapsulant completely surrounds the integrated circuit chips disposed on the substrate. The polymer encapsulant has an upper surface, located above the tops of the integrated circuit chips, which has a plurality of via openings therein so as to expose at least some of the interconnection pads on the chips. A pattern of electrical conductors is provided on the polymer encapsulant such that the conductors extend between selected via openings so as to electrically connect selected interconnection pads. An important feature of the present invention is that the substrate has a flat upper surface, i.e., no milling is required to provide for the integrated circuit chips. Numerous enhancements to this basic embodiment of the present invention are described and claimed herein.

For example, the integrated circuit package may further include a dielectric layer overlying the polymer encapsulant with its interconnection conductors disposed thereon. The dielectric layer also includes a plurality of via openings therein which are aligned with at least some of the interconnection conductors disposed on the polymer encapsulant. A second plurality of interconnection conductors is disposed on the dielectric layer to extend between at least some of the openings in the dielectric layer so as to provide electrical connection with interconnection pattern conductors disposed on the polymer encapsulant. If desired, the module may be rendered repairable by selecting a solvent-sensitive material for the dielectric layer.

Additional package enhancements can include the disposition of one or more preprocessed chips on the substrate's flat upper surface. By way of example, a preprocessed chip may include a flex tab, a chip having a series of conductive lands on a top surface thereof for wire bonding thereto, a tiered power and ground busing structure, and/or a termination resistor. The present invention is also believed to encompass a particularly novel structure wherein an array of electrical contact pads are provided on the upper surface of the package to provide electrical interface to circuitry external to the package, while the substrate's lower surface provides a thermal interface (for example, to a heat sink) for dissipation of heat generated by the integrated circuit chips. Each interface is, in effect, coupled in a direct line path to the integrated circuit chips contained within the module.

In a method for integrated circuit packaging in accordance with the present invention, a plurality of circuit chips is disposed on a flat upper surface of a substrate. Each chip includes at least one interconnection pad. A low viscosity polymer material is employed to surround the chips and the upper surface of the substrate so that all space between the chips is filled thereby. This polymer material is then cured to a hardened, high viscosity polymer encapsulant. A plurality of via openings is provided in the polymer encapsulant, each via opening being disposed over an interconnection pad. Then, a pattern of electrical conductors is provided on the encapsulant such that the conductors extend between the via openings so as to electrically connect selected integrated circuit interconnection pads. As enhancements to the basic method, prior to via opening formation, the polymer encapsulant may be lapped to form a substantially flat upper surface which is parallel to the substantially flat upper surface of the substrate; and/or the integrated circuit chips may be lapped, prior to the encapsulation process, to reduce the thickness thereof. Specific techniques for repair of a module and for disposition of integrated circuit chips on the substrate (both pursuant to the present invention) are described and claimed herein, as well as additional method features hereof.

Accordingly, an object of the present invention is to provide a direct interconnection between integrated circuit chips, said interconnection being highly reliable and requiring a least number of interconnections.

Another object of the present invention is to provide encapsulating layers which can be removed and reapplied to the module so that repair of the assembly is achieved without degrading remaining chip parts which have been tested and found not to be defective.

Yet another object of the present invention is to provide a method of directly interconnecting circuit chips and other electronic components.

A further object of the present invention is to provide an interconnect method with very high speed capability due to the minimum capacitance of the interconnect, minimum length of the interconnect and the use of a polymer dielectric.

A still further object of the present invention is to provide an interconnect method which allows simple attachment of the integrated circuit chip to the substrate for the purpose of heat removal and electrical connection, while accommodating chips of varying thickness.

Yet a further object of the present invention is to provide an interconnect which reduces the overall system size such that the area of the total electronic system is not substantially greater than the area of the individually incorporated electronic circuit components.

A still further object of the present invention is to provide an interconnect system with built in flexibility of the interconnection mechanism so as to accommodate thermal expansion and thermal mismatch between system components.

Still another object of the present invention is to provide a multichip module in a highly planar structure having enhanced resolution, reduced electrical interference to the next level, reduced thermal interference to a heat sink and the capability of stacking modules.

Yet another object of the present invention is to provide a multichip module having a high input output interface capability on one side with effective heat removal capability on the other side. A related object is to provide a high input output interconnect interface capability in a hermetic module wherein heat is removed on one side and I/O electrical connection is provided on the other side.

Lastly, but not limited hereto, an object of the present invention is to provide an interconnection method wherein: the process produces little or no stress on the electronic components with a low potential for damage during normal processing; allows chips to be placed with sufficient accuracy that unmodified art work can be use to pattern direct connection to the chips; allows a variety of materials to be used including thermoplastics and thermal sets while still maintaining a high degree of planarity in the final module; allows the use of completely flat substrates, without the requirement for wells or substrate frames; and allows high volume production.

BRIEF DESCRIPTION OF THE FIGURES

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

FIG. 6b is a bottom plan view of the space molding apparatus depicted in FIG. 6a;

FIG. 16 is a cross-sectional elevational view of one embodiment of an AMCM structure having certain thick components and circuits in wells, pursuant to the present invention;

FIG. 17a is a plan view of one embodiment of a preprocessed chip having a plurality of resistor arrays thereon;

FIG. 17b is a plan view of one embodiment of a resistor array of FIG. 17a;

FIG. 17c is an end elevational view of the resistor array depicted in FIG. 17b;

FIG. 18b is a cross-sectional elevational view of a circuit assembly incorporating the resistor array of FIG. 18a;

FIG. 23b is a cross-sectional elevational view of a modified hermetically sealed AMCM structure similar to the structure depicted in FIG. 23a.

DETAILED DESCRIPTION OF THE INVENTION

This description is divided into three sections. The first is a description of the basic advanced multichip module (AMCM) structure of the subject invention. The second is a description of the processing steps and method used to achieve the basic structure, along with a discussion of the ability of the invention to solve the problems and meet the objectives set forth initially herein. The third section describes variations of the basic advanced multichip module structure invention and methods for fabricating those variations wherein the variations meet further objectives and solve additional problems associated with multichip module structures.

I. ADVANCED MULTICHIP MODULE (AMCM) STRUCTURE

Figure 1:
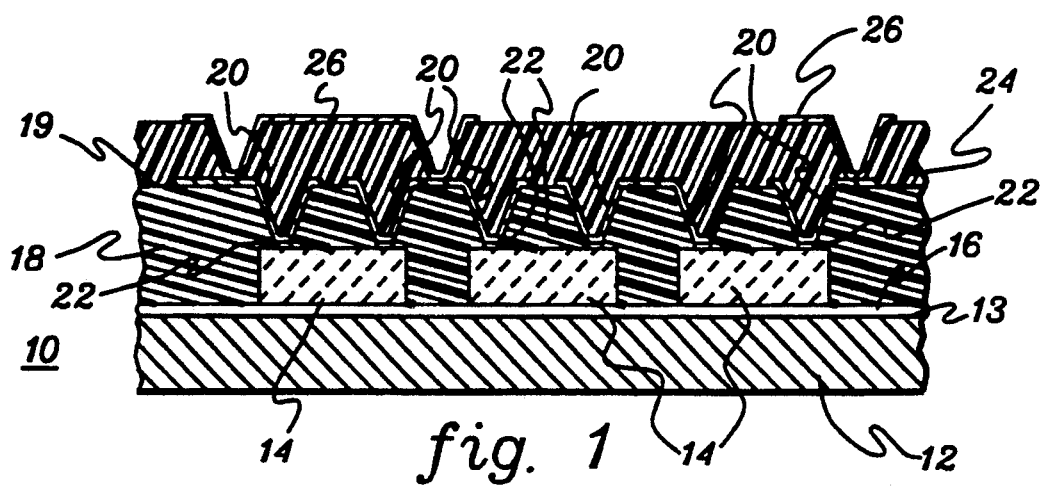
FIG. 1 is a cross-sectional side elevational view illustrating an advanced multichip integrated circuit module (AMCM) in accordance with the present invention.

FIG. 1 shows a cross-section diagram of the basic structure, generally denoted 10, of the present invention. Structure 10 includes a base plate or substrate 12. Substrate 12 can be formed from a large variety of materials including glass, metal, ceramic, plastic, silicon, alumina, aluminum nitride, copper clad molybdenum, Kovar ® (a Westinghouse product) and many other materials. In a novel aspect, the base plate does not require machining of grooves or wells of any kind for placement of the integrated circuits, which is a distinct departure from all know prior art approaches. The only requirement is that the substrate's upper surface 13 be sufficiently flat that the desired degree of planarity can be maintained. Integrated circuit chips 14 are attached to the base plate using a thin die attach material 16, which holds the chips accurately in place during processing and which presents a low thermal impedance for heat removal from the chips through substrate 12. The exact positioning of chips 14 is governed by features on the chips themselves and not by the accuracy of the saw cut edges of the chips. Further, all the chips are thinned to exactly the same thickness so that the top surfaces of the chips are in a plane parallel to upper surface 13 of substrate 12. Specifically, the chips are thinned to a thickness of between 3 and 10 mils, and in a presently preferred embodiment, to a thickness of 6 mils. Thinning the chips to less than 3 mils makes them too fragile to be handled with ease, while leaving the chips thicker than 10 mils creates higher than desired stress levels in the subsequent polymer encapsulant.

The chips are encapsulated in a polymer encapsulant 18, which, in another novel aspect, is applied in a low viscosity or liquid state and subsequently caused to harden in place. This is distinguished from the STD process described above wherein a thermoplastic is pressed over the tops of the chips and forced at high temperature and pressure into the gaps between the chips to an eventual level above the tops of the chips. Although various polymer materials may be used, the polymer material is preferably a formulation based on a UV curable cycloaliphatic epoxy type ZTI1004 obtained from Zeon Technologies of Nashua, N.H. This material allows the polymer to be cured virtually instantly under intense ultraviolet light.

The polymer top surface 19 lies above the tops of ICs 14, for example, by a thickness of 1 to 2 mils, and is planar everywhere with upper surface 13 of the base plate and the top surfaces of the IC chips 14. In the simplest form of the invention, via holes are formed directly in polymer encapsulant 18 and metal 20 is deposited and patterned such that contact is made thru the via holes to the pads 22 of IC chips 14. The metal is patterned to form an interconnect adhered to the polymer surface which interconnects the IC chips. Additional interconnect layers are formed by coating a layer of a dielectric 24, forming via holes in that dielectric to circuitry on the first layer and metalizing and patterning conductors 26 on the second layer to form interconnects between conductors in the first layer. As many layers as required by the circuit can be added in this fashion. Note also that in structure 10, the IC chips can be placed right to the edge of the base plate. Further, since the chips are completely surrounded by polymer encapsulant 18 they are protected during processing from coming in contact with the process chemicals.

II. PROCESS DESCRIPTION

The process is described below in terms of the various unit steps required to achieve the basic structure of the invention. These steps include substrate processing, chip thinning, die attach encapsulation, via formation, metallization and patterning, and fabrication of additional interconnect layers.

Substrate Processing

An important point of the invention is that the starting substrate or base plate requires very little or no processing. This distinguishes the present invention over other techniques such as the above-described STD approach wherein the substrate must be provided with indentations to align the chips accurately. Also, in the overlay approach, substrates must be machined to various depths to accommodate different thicknesses of chips. Pursuant to the present invention, the only processing step necessary for a given substrate material is to prepare the substrate (12) for good adhesion to the die attach material (16) and the encapsulant material (18) (see FIG. 1). This step varies depending on the type of substrate. By way of example, three different types of substrate are discussed here. These are ceramic, metal and silicon.

EXAMPLE 1

In a presently preferred embodiment, ceramic, and specifically alumina, is the substrate of choice. This is because ceramic substrates are readily available, strong and provide good thermal expansion coefficient match to the integrated circuits, which are typically silicon or GaAs. As-fired alumina substrates have been used in this process, but the preferred substrate is a substrate lapped to a specific flatness and thickness specification. Substrates so processed can be obtained from Acumet Corporation of Hudson, Mass. A specification of 25 mils plus or minus 0.2 mil with a 20 micro inch finish gives an ideal starting substrate.

Good adhesion is obtained between the die attach material and the polymer encapsulant through the use of a simple acid cleaning step. The step is performed as follows. A fresh solution of sulfuric peroxide is prepared by mixing concentrated sulfuric acid and 30% hydrogen peroxide in a 50/50 volumetric ratio. Substrates are dipped in the solution for a period of ten minutes, subsequently rinsed in DI water and spun dry in a spin rinser.

EXAMPLE 2

In the case of metal substrates, the metal is cleaned according to various acid cleaning steps well known in the art. For example, molybdenum may be cleaned in an acid pickling solution consisting of 10% nitric acid in DI water. Copper clad molybdenum may be cleaned by brush or pumice cleaning followed by a dip in a solution of Nutra-Clean® (available from Shipley Chemical Company of Newton, Mass.). A dip of one minute is usually sufficient, followed by rinsing in DI water and spin drying. In the case of copper clad substrates, it is essential to coat the copper with a metal which adheres both to the copper and provides a metal oxide surface with good bonding characteristics to polymers. A 200 to 1,000 angstrom coating of chrome or titanium is sufficient for this purpose. The chrome may be applied by electroplating techniques and the titanium by sputtering.

EXAMPLE 3

Silicon substrates are usually coated with a coating of adhesion promoter such as hexamethyldisilane. Methods for coating by dip or vapor phase are well known in the semiconductor art. The adhesion promoter provides a bridge between the glass characteristics of the silicon dioxide on the silicon surface and the organic molecule of the polymer die attach or encapsulant material. The typical range of thickness for substrates is 25 to 50 mils. This gives good thermal conductivity and adequate strength for most applications. Metal substrates as thin as 1-5 mils may be used where the application calls for a structure of very high volumetric efficiency.

Die Thinning

The subject invention requires that IC die be thinned such that they are all the same thickness and that the thickness be in the range of 3 to 10 mils for optimum reliability. IC die are typically available commercially already sawed, and often placed in waffle packs. Die from different vendors are typically of different thickness, and virtually no commercially available die are available in thicknesses as low as 3 to 10 mils. The following description discloses a method for die thinning and die recovery which produces die of very uniform thickness regardless of starting die thickness or size. In addition, the disclosed inventive approach completely protects the active die surface during the thinning and subsequent recovery operations. The disclosed invention is amenable to high volume batch fabrication techniques and has experimentally been operated with batch yields of 100%.

Figure 2A:
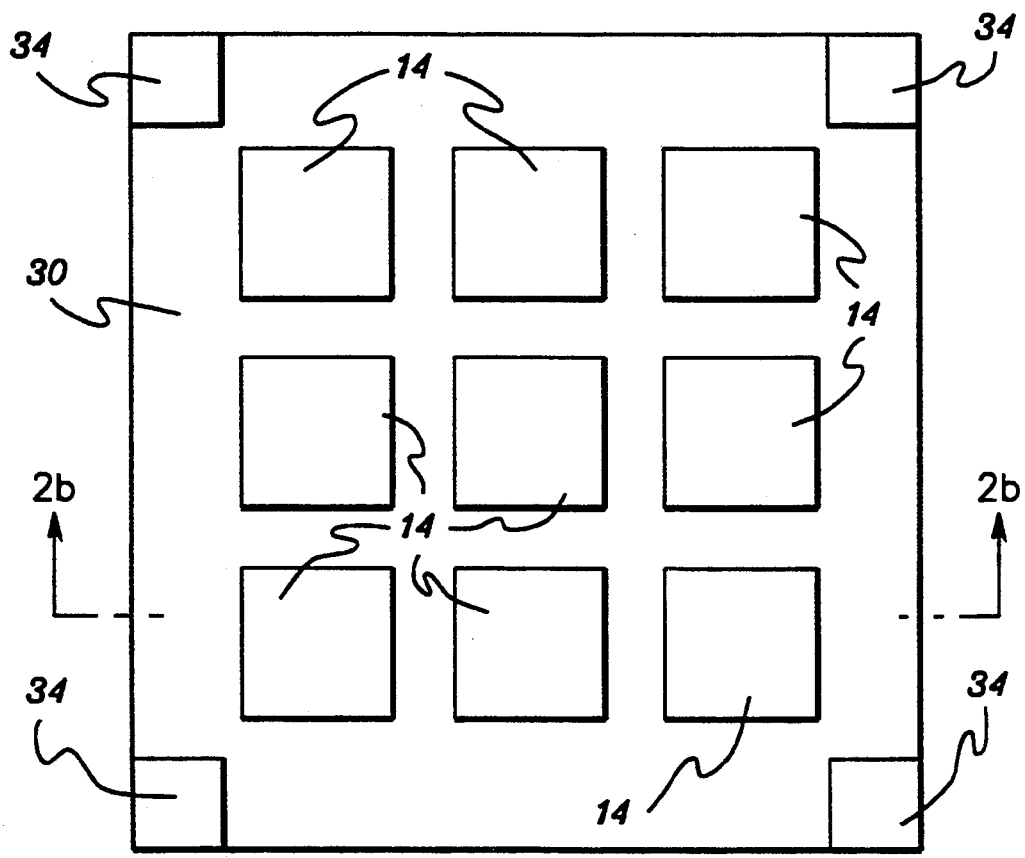
FIG. 2a is a plan view of a fixture plate with chips symmetrically attached thereto pursuant to the present invention.

The chip thinning process starts with a fixture plate 30 (see FIGS. 2a & 2b) which is used to hold the chips 14 throughout the processing. In the preferred embodiment, this fixture plate 30 is a 0.090" thick glass plate. The major requirement of this plate is that it be flat to the desired tolerance to assure consistent processing of the chips. Commercially available window glass can meet this requirement. In the preferred embodiment the glass should be lapped flat to a thickness tolerance of within 0.1 mil. Adhesive 32 is now coated on one surface of the plate, which can be achieved by spin coating or spray coating techniques. An adhesive material suitable for spin coating is disclosed below.

Preferably, an epoxy resin of high molecular weight is used, such as ECN1229, which has a melt point of approximately 100° C. This resin is mixed with an equal portion by weight of cellosolve acetate solvent. To this mix is added 0.2% by weight of FC430 a fluorocarbon wetting agent from 3M Corporation of St. Paul, Minn. The resulting mixture is filtered through a one micron filter to remove all particulate above the one micron level. This mix is then spun at a spin speed of 1,500 rpm for twenty seconds. The plate is baked on a hot plate for three minutes at 150° C. followed by five minutes at 220° C. This removes essentially all of the solvent and leaves the surface dry to the touch at room temperature. The resulting thickness of the adhesive is approximately 10 microns.

The plate 30 with adhesive 32 is then heated to a temperature of 100° C. and chips 14 are placed face down in a symmetrical pattern on the plate. Chips 14 can be placed by picking them from a waffle pack using a vacuum pencil or preferably by using the pick and place machine described in the die attach section of this disclosure with reference to FIGS. 4a and 4b. Note that once the chips have been placed the assembly can be cooled and the chips are held rigidly by the adhesive. Note also that the adhesive material is extremely uniform and very little pressure is necessary to completely wet the surface of the chip with the adhesive such that the chip surface is completely protected by the plate 30 and sealed by the attachment adhesive 32. Because the attach adhesive is low viscosity during the attachment operation, it cannot place any force on the chip surface. In addition it flows readily, thus forming a seal around all the edges of the top surface of the chip, thereby protecting the chip while also holding it in place. Chips 14 are preferably placed symmetrically on the fixture plate 30 because this aids in balancing the actual thinning operation which will be described. The actual thinning operation is done on a commercial lapping machine such as a Spitfire SP-ML-15. More than one fixture plate can be accommodated at one time in the lap machines.

Two methods can be utilized to assure completely uniform thinning of the chips. In a first method, stops 34 of a very hard material, such as alumina, are mounted on the fixture plate 30, preferably in the corners of the plate. These stops are of a thickness equal to the final thickness desired for the chips being thinned. The chips continue to be lapped until the stops are encountered at which time the lapping slows dramatically because the very hard alumina is lapped slowly if at all relative to the silicon or GaAs chips.

In a presently preferred alternative, commercially available adjustable lapping stops with diamond tips are used. These are attached to the lap pressure plate (not shown) and then adjusted so that the sum of the desired chip thickness and the thickness of the fixture plate is equal to the extension of the diamond stop. Such pressure plate fixtures provided with diamond stops are available from Lap Master Incorporated of Chicago, Ill.

After placement of chips 14 on fixture plate 30 the entire assembly is coated with a sealing layer 31, which prevents any material from being lodged under chips 14. The sealing layer on top of chips 14, which is lapped away during the processing, also provides buffering on the chip edges.

A lapping media which has been experimentally used with success consists of 300 milliliters of 5 micron SMA powder available from Spitfire mixed in one gallon of vehicle which consists of ⅓ SAC-5 (available from Spitfire) with the residual water. For a 15" lapping wheel a speed of 48 revolutions per minute was used. A pressure of three pounds per square inch was used for silicon chips. Chips could be consistently thinned from approximately 20 mils to 6 mils plus or minus 0.1 mil within a time period of 12 minutes.

Figure 2B:
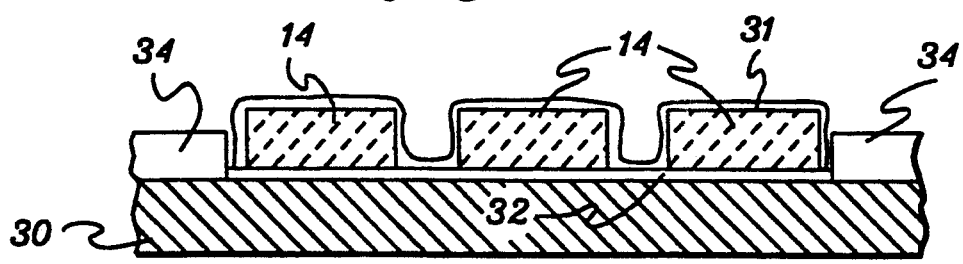
FIG. 2b is a cross-sectional side elevational view of the assembly of FIG. 2a taken along line b—b and overlaid with a protective sealant.
Figure 3A:
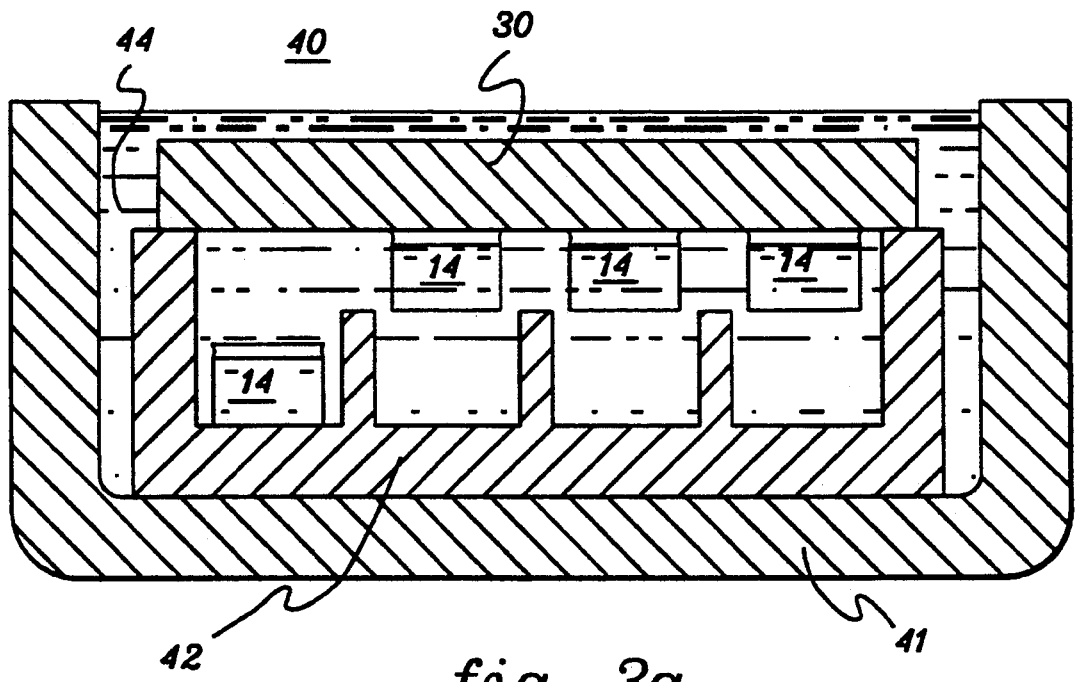
FIG. 3a is a cross-sectional elevational view of one embodiment of a chip recovery process pursuant to the present invention.
Figure 3B:
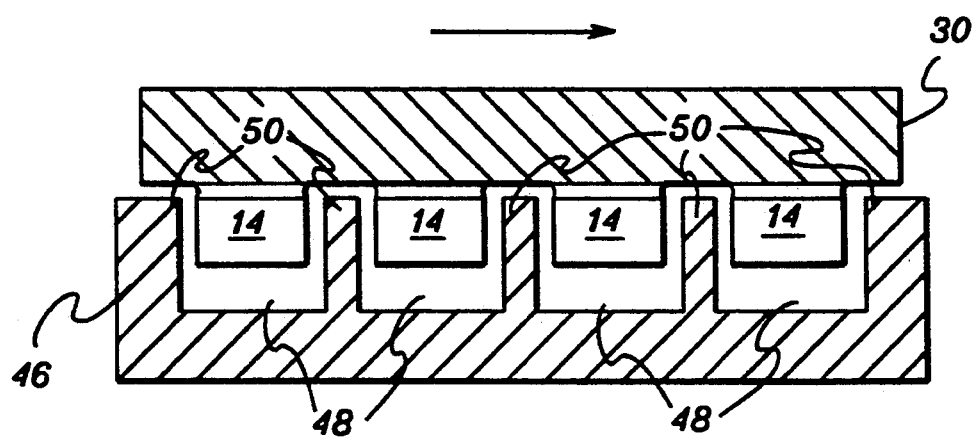
FIG. 3b is a cross-sectional side elevational view of a second embodiment of a chip recovery process pursuant to the present invention.

Once the chips have been thinned, they can be recovered by first cleaning off residual lapping media in a high pressure spray and then placing the fixture plate with chips attached thereto in a container of acetone solvent. FIGS. 3a & 3b show two embodiments of the recovery apparatus. Referring first to FIG. 3a, a solvent recovery apparatus denoted 40, is depicted. Apparatus 40 includes a container 41 and a recovery vessel 42. Note that the fixture plate 30 is positioned so that the chips 14 fall away from the plate to the bottom of the recovery vessel 42. Once the solvent 44 has dissolved the attach adhesive in this way the chips never come in contact with a hard material during any portion of the cycle. Note also that until attachment adhesive is dissolved, the chips are protected both by the plate 30 and by adhesive 32 (FIG. 2b). Certain additional steps can also be taken to give added protection to the chips during the thinning process (i.e., the application of sealing layer 31 (FIG. 2b)). This is of value when using very small chips or chips of very sensitive materials.

The additional steps occur after the IC chips have been mounted face down on the attach adhesive on the fixture plate. At this point a side protection material (31) is applied, preferably by spinning techniques. This material further seals the chips to prevent any possible lapping material from contacting the active surface of the chip. The same material as used for the adhesive can be used, along with a spin speed of 800 rpm and drying temperature of 150° C. The advantage of this approach is that the sealant can be easily dissolved in a solvent such as acetone. Dissolving the sealant also removes any of the lapping media which may have deposited on the fixture plate surface. This keeps both the chip active surface clean as well as the fixture plate.

A clean fixture plate is advantageous in a presently preferred chip recovery embodiment (FIG. 3b). After lapping and cleaning, the fixture place is heated above the melting point of the adhesive (e.g., 120° C.). The fixture plate 30 is placed on a waffle pack 46 such that the chips 14 are in the wells 48. The plate is drawn slowly across the waffle pack 46. Chips are prevented from moving by the walls 50 of the waffle pack as the carrier plate 30 moves away. As a result the chips quickly loose adherence to the fixture plate and fall into the waffle pack. The flow dynamics are such that the adhesive adheres to the chips and protects them. Since the fixture plate is clean there is no danger of damage to the chips due to foreign substances. If the waffle pack is further provided with holes in the bottom and a cover with holes, chips can be soak cleaned in acetone (not shown).

Die Attach Apparatus And Process

The subject invention depends upon placing die with sufficient accuracy that the pads of the chips line up with fixed positions for via holes and interconnect pads. By doing this the need for adaptive lithograph is eliminated and standard mask type processing can be used. As described initially herein, it is necessary both to place the die accurately according to features on the die and to provide a means by which the die remain in place without swimming or moving by capillary attraction during the full curing process.

Figure 4A:
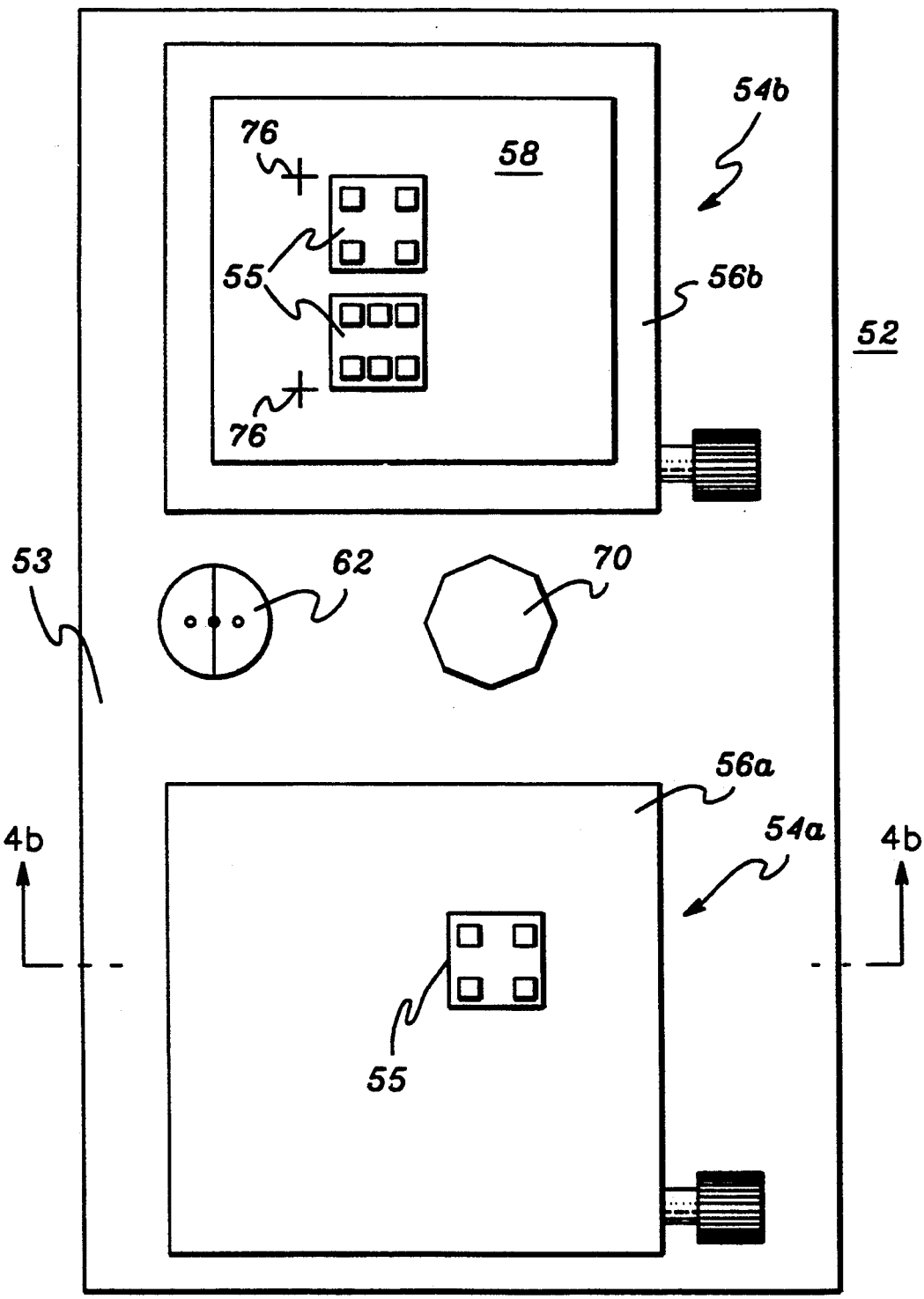
FIG. 4a is a simplified plan view of one embodiment of a die attach apparatus pursuant to the present invention.
Figure 4B:
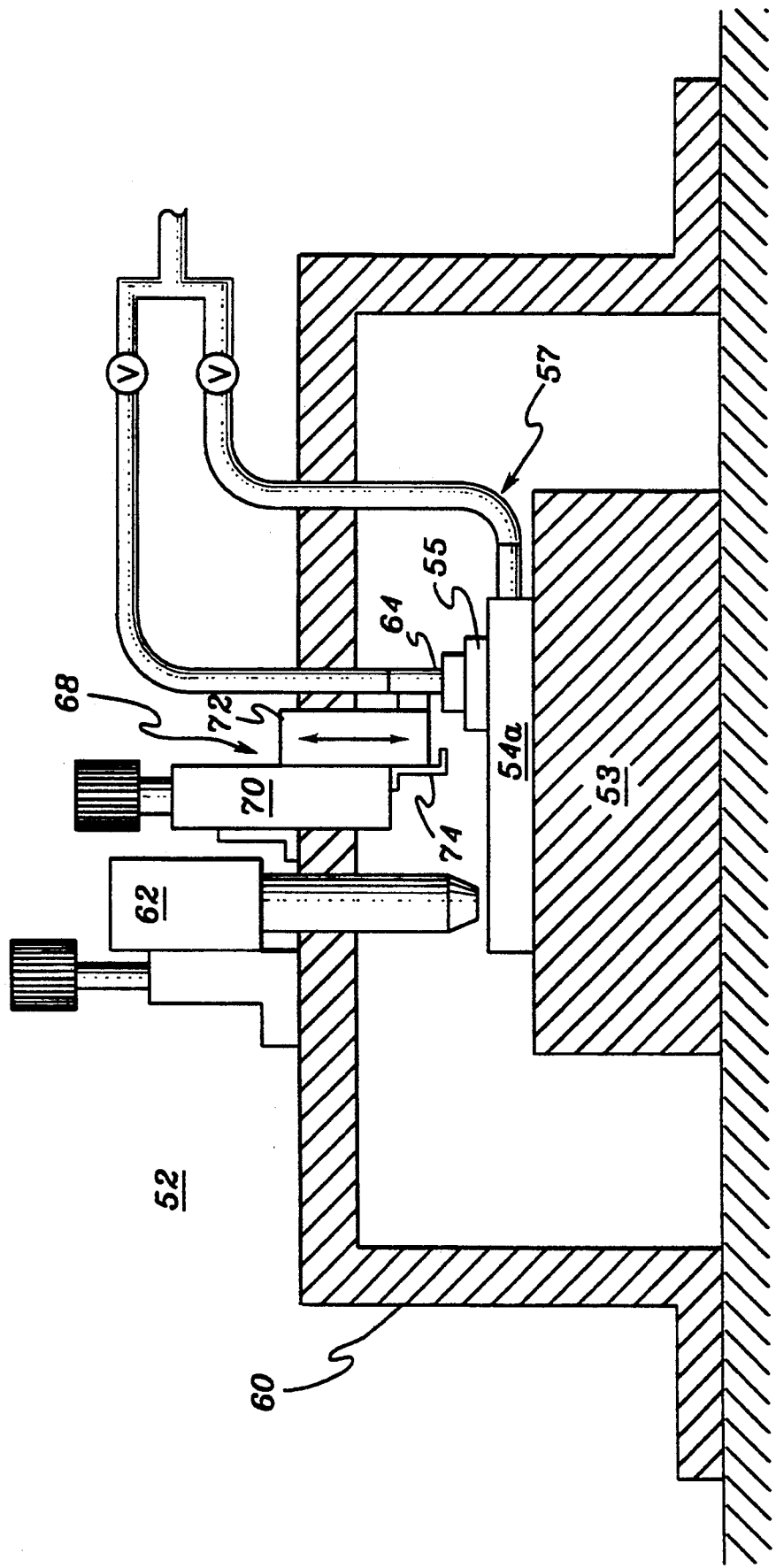
FIG. 4b is a cross-sectional elevational view of the die attach apparatus of FIG. 4a taken along line b—b.

FIGS. 4a & 4b show plan and cross-sectional elevational views, respectively, of a die attach apparatus 52 pursuant to the present invention. Apparatus 52 includes a high accuracy XY table 53 whose position is ultimately controlled and monitored by an AT type personal computer (not shown). Mounted on XY table 53 are two rotational adjustment stages 54a, 54b. On one stage 54a is provided a chip positioning fixture which consists of a flat plate 56a with a hole in the center connected to a controllable vacuum source 57. Chips (e.g., 55) are placed on this alignment stage 54a and held in position by the vacuum 57. The second stage 54b holds a plate 56b which is machined to accept the desired substrate 58. Shims (not shown) are provided so that the height of the active portion of the chip on the alignment stage 54a is the same as the height of the active portion of the chip 55 when placed on a substrate 58 which is mounted on the substrate alignment stage 54b. This is done to reduce the number of times that the focus of an alignment microscope must be changed during operation.

A bridging structure 60 is provided over the top of the XY stage which is used to hold an alignment microscope 62 and a vacuum die pickup 64. The throw of the XY table 53 and the position of the alignment microscope 62 and die pickup tool 64 are chosen so that all points on the die 55 and all point on the substrate 58 can be placed under both. The alignment microscope 62 is mounted such that it can be focused and the focusing direction is directly perpendicular to the plane of the chip 55 on the alignment stage 54a and the substrate 58. The die pickup tool 64 is mounted on a two stage motion device 68. The first stage 70 is mounted rigidly to the bridge 60 such that it may be moved vertically in a direction perpendicular to the plane of the chip 55 on the alignment stage 54a and the substrate 58.

A second stage 72, which holds the actual alignment tool 64, is mounted on the first stage 70. While the first stage 70 is raised and lowered under control of a micrometer, the second stage can move freely up and down in the same direction as the first stage but there is no hard positioning control 74, such as on the first stage 70. As such the second stage 72 is held against the lower stop 74 until the pick up tool is lowered by the first stage 70 and comes in contact with the top of the chip 55. At this point, the second stage 72 begins to rise and the weight of the second stage 72 is placed on the top of the chip 55 through the pickup tool 64. In this way a controlled pressure equal to the weight of the second stage 72 (e.g., 400 grams for a quarter inch chip) is placed on the chip 55 regardless of the position of the first stage 70 until the second stage engages the stop on the first stage and lifts it vertically. The amount of weight in the second stage can be adjusted by placing weights on the second stage 72.

The actual operation of the die attach apparatus proceeds as follows: A substrate 58 which has been coated with the die attach material is placed on the substrate alignment stage. (A full description of the die attach material invention is given in a subsequent portion of this section.) For now, the necessary characteristic of the die attach material is that it be uniform without large particulate and that it be sticky. The die 55 to be placed is placed on the die alignment stage 54a and the vacuum hold-down 57 to that stage is energized. The first step in the process is to rotate the substrate 58 until it is square with the chosen fiducial marks 76 on the substrate. All subsequent chip placement will be in relation to the chosen fiducial marks 76. Once the substrate 58 has been rotated so that it is square with the fiducial marks, the next step is to note the exact position of the reference fiducial mark. This is done by placing the reference fiducial mark under the cross hair of the alignment microscope 62 and interrogating the XY table 53 control to determine the absolute position of the reference mark. The substrate reference mark position is saved.

Next the chip 55 to be placed is made square with the table motion by aligning two pads on the chip whose position is known. Once the chip is square, a note is made of the exact position of the reference pad. A file containing data from a measurement of this chip is used to determine the relative distance from this reference pad to the center of the chip. A measurement of the distance from the center of the cross hair on the alignment microscope to the center of the pickup tool 64 is known. The stage 54a then moves from the position with the reference pad under the microscope cross hair to the position where the center of the chip is directly under the center of the pickup head.

The pickup head 64 is then lowered until it makes contact with the top of the chip 55. Lowering continues until the full weight of the second stage 72 is transferred through the pickup head to the top of the chip. At this point the vacuum for the pickup head is turned on and the vacuum 57 for the chip alignment stage 54a is turned off. The pickup head is then raised until the chip is picked up from the alignment stage and is sufficiently high to clear the substrate and any chips mounted thereon. The exact position of the substrate reference fiducial has been noted. As an option, this value can be input to the XY table controller and the substrate reference fiducial placed directly under the cross hair of the alignment microscope. A section of memory in the control computer is preferably programmed with a table of the desired position of the chip reference pad relative to the reference fiducial mark on the substrate.

The chip is now being held by the pickup tool with the center of the pickup tool preferably aligned to the center of the chip. The substrate is moved to a position which represents the substrate fiducial directly under the chip reference pad plus an offset inserted from the table of relative positions for the given chip reference pad relative to the substrate fiducial. With the substrate properly positioned under the chip, the chip is lowered until it contacts the surface of the substrate which is covered with the die attach adhesive. Lowering of the mechanism continues until the full weight of the pickup tool second stage is applied to the top of the chip. This position is held for a period of time (preferably five seconds) to give good wet out to the bottom of the chip by the die attach adhesive. This exact process is repeated for each chip to be placed. Note that before the pickup head is raised, the vacuum to the pickup head is removed.

In an alternate embodiment, the first chip could be placed relative to the corner of the substrate, and all subsequent chips could be placed relative to the first chip. This approach is thought to be particularly novel. It solves a problem associated with the fact that the substrate is not usually provided with a fiducial or feature which can be identified under a microscope to the desired accuracy of a few microns. Typically, the corner of a substrate is only accurately identifyable to 100 microns due to rounding at corners and lack of perfect squareness of the two sides defining the corner. This does not impact the performance of the substrate in any way but makes the task of accurate placement of the chips extremely difficult. By placing the first chip relative to a feature on the substrate, the first chip will be located to any accuracy of 100 microns. By placing subsequent chips relative to the first chip all other chips will be placed with an accuracy governed by the ability to identify features on the chip, which are normally better than 1 micron in accuracy.

To do this, the first chip is placed as described above. To place the second and subsequent chips the following procedure is used. The XY table is positioned so that the desired feature on the first chip which will be used as a fiducial is directly under the alignment microscope cross hairs. The absolute position is noted and saved. Note that this feature can conveniently be the reference pad used to place this chip. Next the second or subsequent chip is placed on the alignment stage and squared to the table motion by aligning two interconnection pads whose position are known. Once the chip is square, a note is made of the exact position of the reference pad. A file containing data from a measurement of this chip is used to determine the relative distance from this reference pad to the center of the chip. A measurement of the distance from the center of the cross hair on the alignment microscope to the center of the pickup tool is known. The stage then moves from the position with the reference pad under the microscope cross hair to the position where the center of the chip is directly under the center of the pickup head. The pickup head is then lowered and the chip picked up as previously descibed. A section of memory in the control computer is programmed with a table of the relative position of each chip reference pad and the reference mark on the first chip.

The substrate is now moved until the reference mark on the first chip is directly under the reference pad on the chip being held by the pickup plus the relative offset from the table of relative positions. With the substrate properly positioned, the chip is lowered as previously described. The net result is that all subsequent chips will be positioned relative to the position of the first chip so that all chips will be accurately positioned relatively to one another even if they are not precisely positioned relative to the substrate. Art work and masks are then aligned to the chip positions so that the requisite high precision alignment can be maintained even though the substrate contained no high precision features.

Accurate chip positioning in the final assembly depends both on accurate mechanical positioning and on the ability of the material system to hold the chips in place during the curing cycle. In this section a material system is disclosed which has several advantageous properties. Specifically, it can be applied by spin or spray coating techniques to achieve a very thin uniform coating. It can be dried free of solvent but remains extremely tacky or sticky in order to hold chips in place. It an be cured either by UV light or high temperatures; and its viscosity reduces and wet out improves with increases in temperature.

A presently preferred embodiment of the method of die attach is as follows. A clean flat substrate is used as the starting point. The die attach material is spun at 1,500 rpm for a period of 20 seconds. The substrate with material is dried on a hot plate at 100° C. for a period of 7 minutes. At this point, the die attach material is approximately 7 microns thick and very sticky although free of solvent. Next the die are placed as described in the preceding paragraphs. The material is sufficiently thin in coating and highly viscous such that there is no interference between adjacent die. That is, little material is squeezed from under the die and forced up between the adjacent die. Although some is, it is not sufficient to put enough shear force on the die to cause them to move. After the die have been placed, the substrate is exposed to UV light. A total energy of 5 joules per square centimeter is used. This cures the die attach material solidly around each die and cures the material slightly under each die due to light scattering effects.

Next, the substrate is placed on a hot plate at a temperature of 150° C. for a period of 5 minutes. This reduces the viscosity of the die attach material under the chip and improves wet out. At this point, the die attach material can be baked at a temperature of 220° C. for a period of 20 minutes. This effectively totally cures the die attach material. This last post bake step is unnecessary if subsequent processing will eventually lead to a post bake step of 220° C. for a period of 20 minutes or more.

It is important to note that at the time the die are placed, the material system is free from solvent. In this way baking at high temperature can occur without evolution of solvent and forming of blisters under the die. By using this approach essentially any die size can be accommodated with a very fast curing cycle since no time must be allotted for solvent to diffuse through long sections of the die attach material. The thermal curing mechanism is chosen so that the temperature of the die attach material can be raised after coating to a sufficient temperature to allow evolution of all solvent without curing the die attach material. Note also that because the coating is very thin and exposed to the atmosphere during the drying process that effective and thorough solvent removal can occur.

Below is a table showing the formulation and mixing of the die attach material.

TABLE 1

| DIE ATTACH INGREDIENTS | |
|---|---|
| Material | Source |
| 10 gm ZOL3A | Zeon-Technology, Nashua, N.H. |
| 5 gm 9AMOD | Zeon-Technology, Nashua, N.H. |
| 4 gm Cellosolve Acetate | JT Baker, Phillipsburg, N.J. |
| 0.2 gm FC430 Wetting Agent | 3-M, St. Paul, MN |
| 1.6 gm Cyracure UVI6974 | Union Carbide |

This system is mixed and baked in an oven at 100° C. for a period of one hour twenty minutes. In order to effect mixing and not allow the material to cure in concentrated locations, the mix should be shaken every fifteen minutes during cure. After the above mixture has cooled to room temperature, 1.6 grams of Cyracure UVI6974 (available from Union Carbide Corporation) is added. This is the ultraviolet curing agent. The mixture is then filtered through a filter of 3 microns. This removes any particulate above 3 microns and prevents particulate from causing chip damage and offset or improper wetting of the bottom of the chips.

Using the above described inventive technique, chips have been experimentally placed relative to a fiducial on the substrate using only a flat substrate without pockets or alignment marks machined in it. In addition, the chips were placed by alignment to features on the chips themselves. Using a sixteen chip module as a demonstration the maximum degree of misplacement for any chip was less than 10 microns. This clearly allows the use of present IC chips with bond pad sizes of 75 microns square and allows expansion to future generations of chips with even smaller bond pad dimensions and spacing.

Encapsulation

In this section several methods, apparatuses and materials for effecting encapsulation of the multichip module of the present invention are disclosed. The common attribute of each of these is that the encapsulant is applied at low viscosity in the liquid state and subsequently caused to harden or cure to the final tough or rigid encapsulation state. This represents an improvement over encapsulation methods taught in the STD patents because the chips are not subjected to the damage potential of high pressure, high temperature and encapsulant motion which could tend to scratch or otherwise break runs on the chips. The methods of encapsulation disclosed are divided into four main groups, normally: 1-Gap Fill and Overcoat, 2-Doctor Blade, 3-Controlled Space Molding, and 4-Apply, Cure and Lap.

1-Gap Fill And Overcoat

In this method, sufficient encapsulant material is applied to the substrate such that the space between IC chips is filled but the encapsulant material comes at or near the tops of the chips. The gap filling material is then cured and a subsequent material, either different or the same, is coated over the top of the chips and the gap filling material. This particular approach allows the overcoat material to be different from the gap filling material. The major requirement for the gap filling material, i.e., besides the desired final cured properties, is that it must be sufficiently low viscosity that it flows and fills the area between adjacent chips. A material which has successfully been used experimentally for this purpose is ZOL3A from Zeon Technologies of Nashua, N.H. This material is actually a solid at room temperature but it approaches water like viscosities at temperatures, e.g., 100° C. At these temperatures the material takes approximately one hour to reach the gel state. At temperatures of 150° C. to 180° C. the material cures in approximately ten minutes.

The process proceeds as follows: A substrate 80 with chips 82 attached is provided with a frame 84 which is at least the same thickness as the chips (See FIGS. 5a and 5b). This frame 84 acts as a dam for containing the encapsulant material (not shown). In one embodiment, the frame is permanently attached (e.g., via an adhesive 83) to the substrate at the same time the die are placed. The frame can be made of either alumina or silicon. In a second embodiment, the frame is temporary and consists of high temperature tape adhesively bonded to the substrate. A suitable high temperature tape is M797 available from CHR Industries of New Haven, Conn.

The substrate 80 with frame 84 attached is placed on a hot plate (not shown) at 100° C. The gap fill material is introduced to any free portion of the substrate within the containment frame (and not directly on top of the chips). (Again, the first encapsulant is to only fill in the spaces between the chips, afterwhich a second layer is placed over the top.) At this point, the low viscosity encapsulant material flows to all points within the containment frame. It is necessary to keep the substrate level and to provide the encapsulant material in such quantity and at such a rate that the material does not exceed the height of the IC chips. If the material is applied at too high a rate, then a buildup in a portion of the substrate will occur and the tops of the chips will be covered by the gap filling material. A convenient way to assure that the correct amount of gap filling material has been applied is to use a high accuracy scale which weighs the difference between the substrate plus hot plate and the added gap filling material. Since additional material will be applied over the tops of the chips it is not necessary to perfectly fill to the edge of the chips but only to come within some reasonable distance. For example, if the chips are 6 mils thick coming within a mil of the top of the chips is sufficient. One part in six is only a 16% control which is not difficult to achieve.

After the gap fill material has been applied to the substrate, the substrate is transferred to a 150° C. hot plate for a sufficient period to cure the gap filling material. If a temporary frame was used it is now peeled from the substrate. At this point any desired dielectric material can be sprayed or spun over the tops of the chips to complete the encapsulation. By way of example, SPI129, a silicone polyimide available from MICRO SI of Phoenix, Ariz. can be spun at a speed of 2,000 rpm for a period of twenty seconds and dried ten minutes at 100° C., ten minutes at 150° C. and twenty minutes at 220° C.

In an alternative approach, a UV curable encapsulant material such as ZTI1004 available from Zeon Technologies of Nashua, N.H. can be used. In this approach material is actually filled to above the chip line. This material is liquid at room temperature and need not be raised in temperature to achieve a sufficiently low initial viscosity. Once the gap fill material has been applied, the back surface of the substrate is radiated with UV light. The alumina substrate allows a substantial portion of the UV light to pass through to the polymer. The silicon chips however absorb the UV energy and do not allow any UV to pass in the area where the chips are. This results in selective curing in all the area around the chips, that is, in the gaps between chips and not in the area above the chips. Acetone or other suitable solvent is then used to wash away the encapsulant material above the chips. At this point, an overcoat layer is applied which coats over the tops of the chips and over the gap filling material. This eliminates the need for any high degree of care in filling the gaps while trying to avoid covering the chips with encapsulant material.

2-Doctor Blade

Figure 5A:
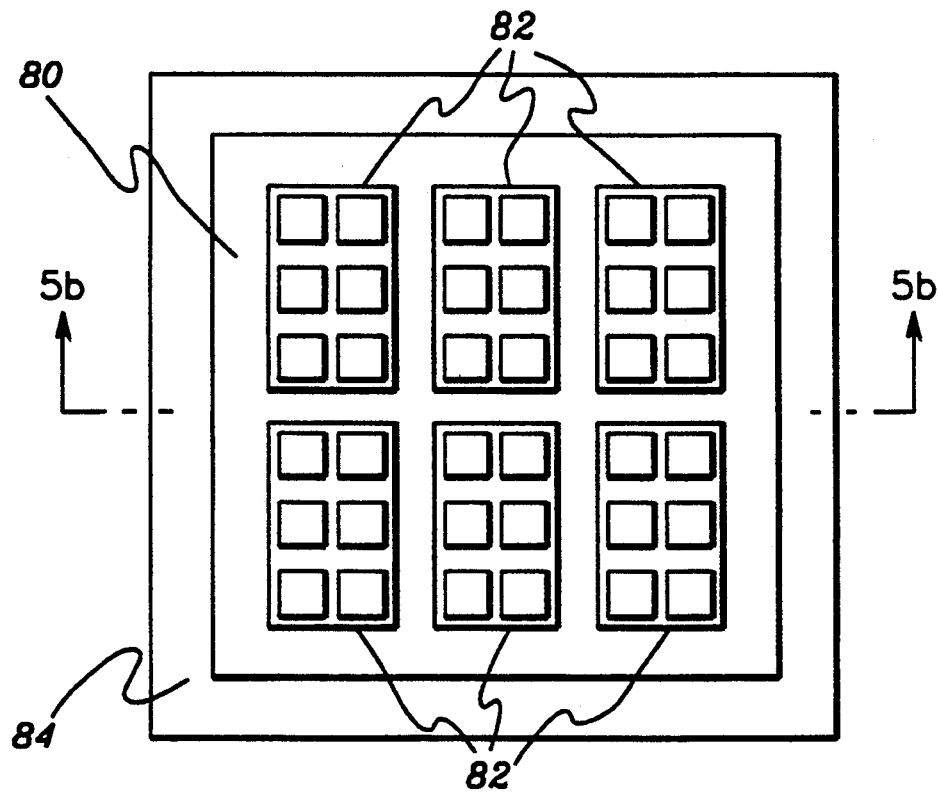
FIG. 5a is a plan view of a chip/substrate structure positioned within a containment frame used in one embodiment of an encapsulation process pursuant to the present invention.
Figure 5B:
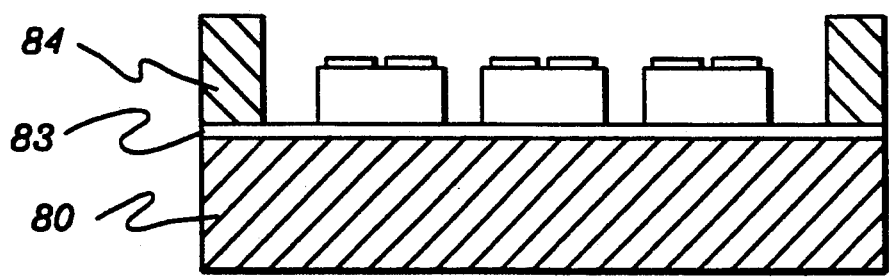
FIG. 5b is a cross-sectional elevational view of the structure depicted in FIG. 5a taken along line b—b.

In this approach, a substrate with chips attached thereto is provided with a containment frame which is slightly higher than the tops of the chips (e.g., see FIGS. 5a and 5b). Encapsulate material is applied to the substrate by doctor blading techniques. In this technique, a bead of material is dispensed at one end of the substrate. A doctor blade or straight edge is drawn across the substrate. Because the frame sits higher than the tops of the highest chip. The material is drawn across the substrate to a height just slightly higher than the tops of the chips. Curing is then effected by heat or UV light depending on the material used. Either ZTI1004, which is UV curable, or ZOL3A, which is heat curable, can be used. These materials are both available from Zeon Technologies of Nashua, N.H. The frame for material containment can be a temporary frame, as described in the previous section, or it can be a permanent frame which is attached to the substrate at the same time that the die are attached.

3-Controlled Space Molding

Figure 6A:
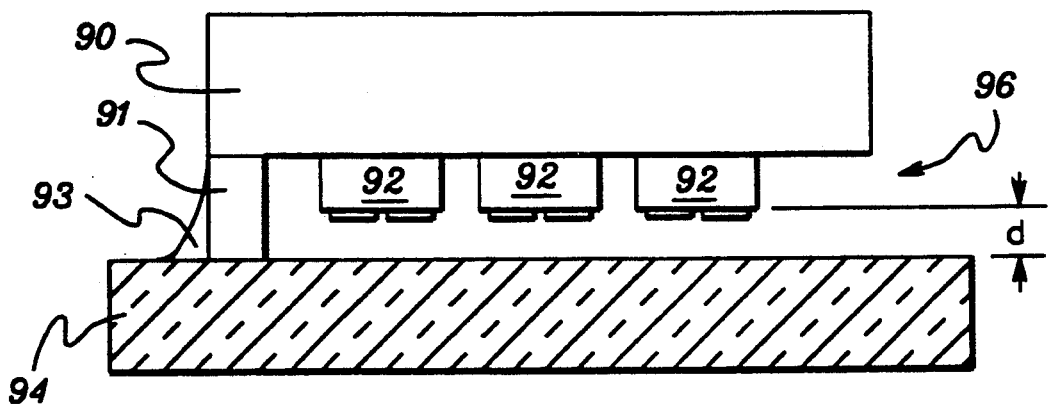
FIG. 6a is a cross-sectional elevational view of an embodiment of a controlled space molding apparatus pursuant to the present invention.
Figure 6B:
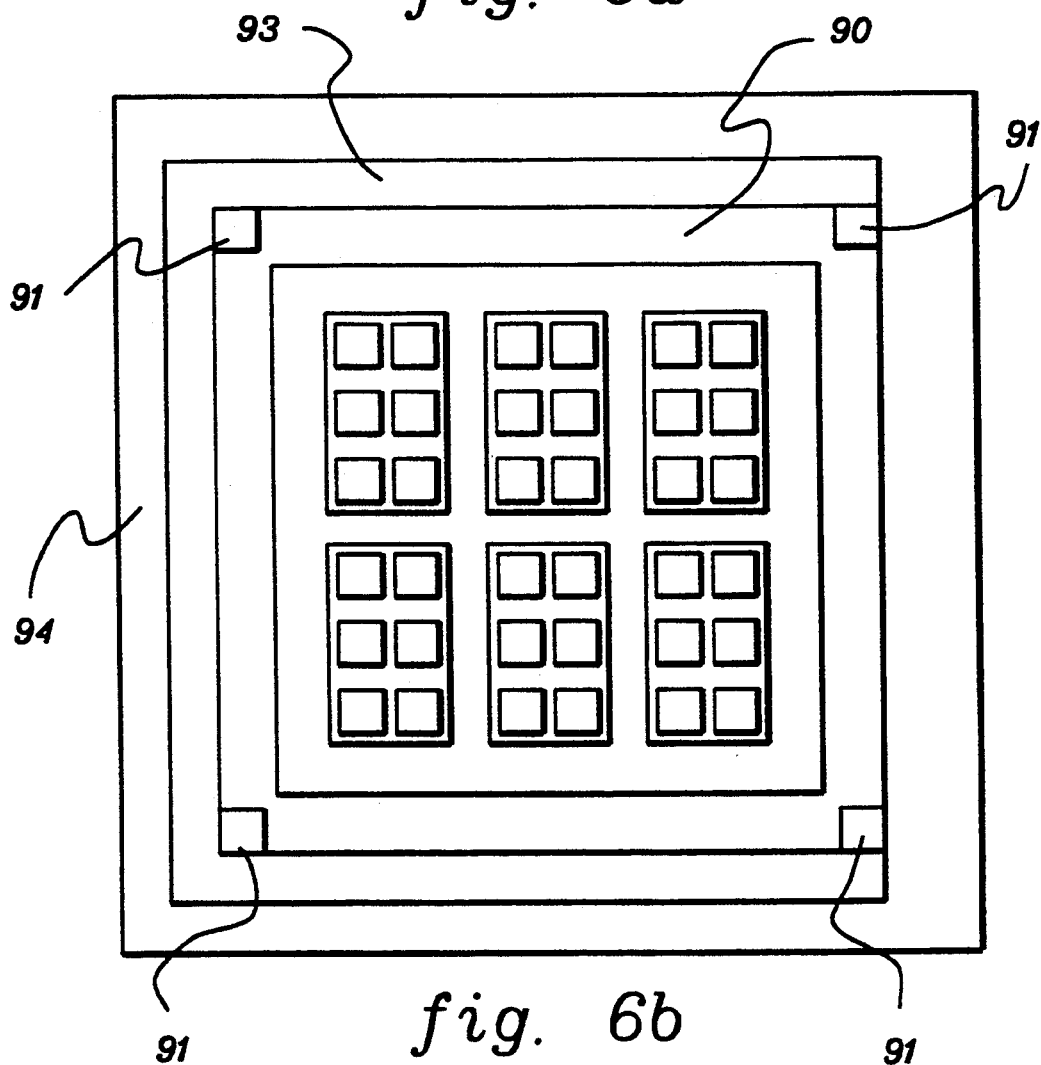

In this technique, the substrate 90 with the chips 92 attached thereto is spaced a precise distance away from a flat plate 94 by spacing elements 91. The distance 'd' is set so that the tops of the chips are between 1 and 2 mils away from the flat plate 94. A sealing material 93 wraps around the three sides of the structure. Encapsulant (not shown) is then introduced at one end 96 of the flat plate 94. FIGS. 6a and 6b show a plan view and cross-sectional elevational view of the controlled space mold. ZOL3A can be used as the encapsulant. If this material is used, then the mold must be heated to a temperature exceeding 150° C. for a period of ten to fifteen minutes to solidify the encapsulant material. Once the encapsulant has solidified, the apparatus is cooled and the substrate removed. To aid in releasing the substrate from the surface of the flat plate, conventional mold release agents such as silicone or fluorocarbon can be used. The flat plate can be a glass plate, which has the attributes of a high degree of flatness, thermal stability and ready availability.

Figure 7A:
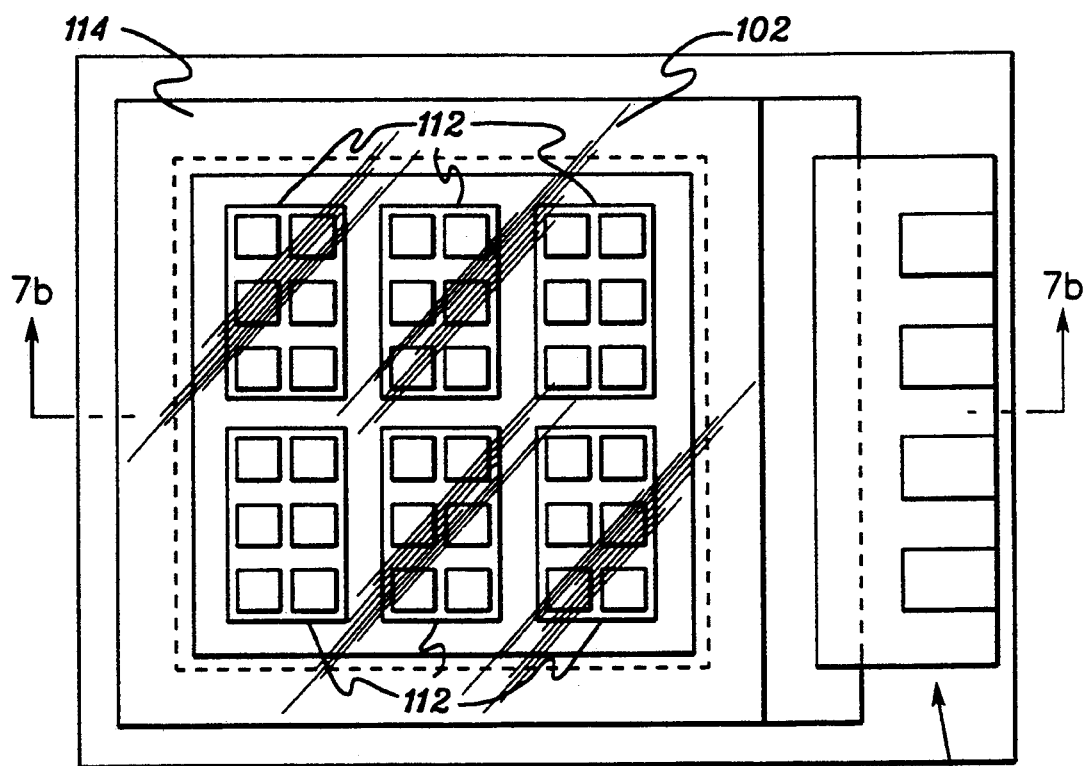
FIG. 7a is a plan view of a second embodiment of a controlled space molding apparatus pursuant to the present invention.
Figure 7B:
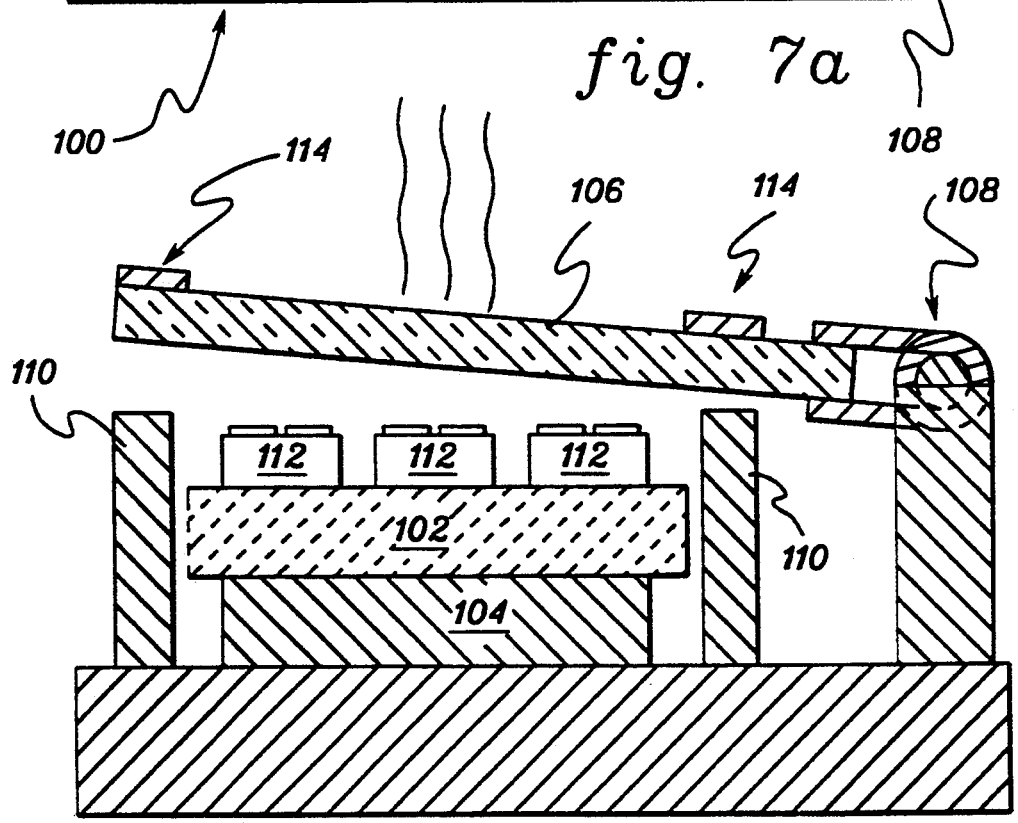
FIG. 7b is a cross-sectional elevational view of the space molding apparatus of FIG. 7a taken along line b—b.

A novel variation, depicted in FIGS. 7a and 7b, of the controlled space molding technique involves the use of a unique molding apparatus 100 coupled with a UV curable encapsulant (not shown). In this approach, the substrate 102 is held by a vacuum holddown chuck 104. UV curing material is introduced to the assembly at one end of the substrate. A glass plate 106 attached to a hinge apparatus 108 is hinged down over the top of the substrate. Precision stops 110 between the plate 106 and the substrate 102 ensure that the glass plate is held between 1 and 2 mils above the tops of the chips 112. As the plate is hinged down the encapsulant material is forced across the entire substrate. By dispensing the proper amount of material, excess material squeezed out around the edges of the substrate can be kept to a minimum. Because of surface tension effects, the encapsulant material stays in contact with the glass plate. The encapsulant material is now exposed using UV light which is irradiated through the glass. A mask is used to prevent UV light from curing material beyond the edge of the substrate.

When the curing process is completed, the encapsulant is cured in all areas above the substrate but will not be cured in those areas where encapsulant material was squeezed out beyond the substrate. The uncured encapsulant material can easily be washed away in a solvent such as acetone and the encapsulated substrate removed from the glass plate. To aid this removal process silicon or fluorocarbon release agents can be applied to the glass plate. An acceptable encapsulant compound, which is liquid at room temperature and UV curable, is ZTI1004 available from Zeon Technologies of Nashua, N.H. The end result is an encapsulated substrate wherein the encapsulant comes to the edges of the substrate without the use of containment frames. The top of the encapsulant mimics the surface of the glass which is extremely flat and free of defects. The process can be conducted at a high rate of speed with little wastage of material. The energy required to cure the substrate to the point that it can be removed from the glass plate is one joule per square centimeter, at a wave length below 330 nanometers. Instead of a sodalime glass plate it is preferred to use quartz due to its high transmission at the UV wave length used.

4-Apply, Cure And Lap Method

Figure 8A:
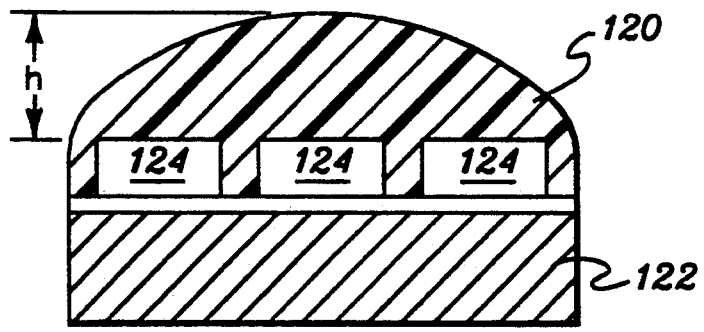
FIG. 8a is a cross-sectional elevational view of one embodiment of a multichip integrated circuit module prior to lapping pursuant to one processing embodiment of the present invention.

This is the presently preferred embodiment for the encapsulation step in fabrication of the advanced multichip module of the present invention. In this process, sufficient material 120 is applied to the substrate 122 with chips 124 attached thereto so that the encapsulant material is higher 'h' than the chips on the substrate by at least 2 mils everywhere on the substrate (FIG. 8a). After the material is cured, lapping techniques are used to achieve a flat planar surface which is parallel to the tops of the chips, and which exhibits a very high degree of flatness. In one embodiment, the final thickness of the encapsulant material is controlled by lap stops which can be alumina and can be attached to the substrate at the same time the die are attached. These stops are 1 to 2 mils thicker than the thickness of the chips. Lapping proceeds at a reasonably fast rate until the lap stops are encountered at which time the lap rate essentially goes to zero.

Figure 8B:
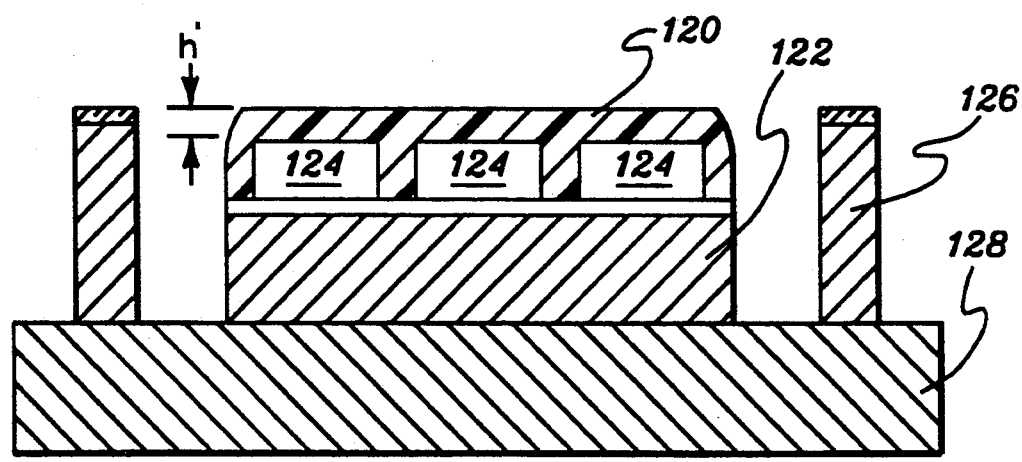
FIG. 8b is a cross-sectional elevational view of the module depicted in FIG. 8a after lapping in the depicted apparatus.

In a second approach, shown in FIG. 8b, diamond lap stops 126 are precision mounted on the lapping pressure plate 128. The diamond stops and lap pressure plate are available from Lap Master Incorporated of Chicago, Ill. Again, lapping continues until the diamond stops come in contact with the lapping plate (not shown) at which time no further pressure is applied to the substrate and the lapping rate time goes to essentially zero. The apply, cure and lap method is especially desirable because it allows the use of essentially any material, it gives a very precise control over flatness and parallelism of the encapsulant surface and it allows the application process and the precision thickness control to the separated.

To better understand the value of this technique consider the use of a solvent born encapsulant material such as Silicone Polyimide type SPI135. Since this material is in a solvent the removal of the solvent in any of the other known encapsulation techniques would result in significant shrinkage in areas where the encapsulant was thick and less shrinkage in area, such as over the tops of the chips, where the encapsulant was thin. As a result, the desired high degree of planarity of the encapsulant could probably not be achieved, i.e., without the apply cure and lap process of present invention. The material can be applied by spin coating at a very low speed and subsequently baking to remove solvent. Although the resulting encapsulant surface after baking would not be flat, the lapping operation would achieve the required degree of flatness as long as the drying operation resulted in encapsulant material sufficiently above the chips on all parts of the substrate. It can be seen that the effects of shrinkage in the encapsulant material due to the drying and curing operations can be totally eliminated by the use of this technique. Another advantage of this technique is the simplification of the process of applying the encapsulant material. For example, in the presently preferred embodiment the ZTI1004 is applied to a substrate with chips attached and spun at a speed of 400 rpm for 15 seconds. The substrate with encapsulant applied is then placed under UV radiation and radiated with five joules per square centimeter of UV energy. The entire process can be accomplished in under a minute. Because the material is substantially above the tops of the chip and because it is a low viscosity liquid, trapped bubbles which can occur in other processing steps or particles due to mold surface or doctor blade contamination are eliminated. The process is extremely simple to perform with very wide margins of processing error.

In the presently preferred embodiment, the lapping abrasive is SMA5 mixed 600 millimeters of SMA5 with one gallon of vehicle consisting of ⅛ SAC5 and the rest water. Using a 15" Spitfire lapping machine with a wheel speed of 60 rpm, a consistently flat and planar encapsulant surface can be achieved with a thickness of 1 mil above the tops of the chip by lapping for a total time of twelve minutes.

After scrubbing the lapped surface, the surface is ready for the next step which is via hole formation. In certain cases where a polished encapsulant surface is desired, such as very high frequency circuits, a so called hard coat layer can be applied. This is done by spinning the desired dielectric material usually at a relatively high speed or spraying a relatively thin coat of the hard coat material to fill in the inherent scratches caused by the lapping process. In a presently preferred embodiment, ZTI1004 is also used as the hard coat. This is spun at 6,000 rpm, UV exposed with 0.5 joule per square centimeter of UV energy and then baked for five minutes at 150° C. and twenty minutes at 220° C. The lapped surface provides for excellent wetting and flow out.

Via Formation

Three different methods can be used to form via holes in polymer dielectrics. These are reactive ion etching, photo patterning and laser ablation.

1-Reactive Ion Etching

In this process the substrate is electrically attached to a source of RF energy. The substrate is placed in an evacuated chamber which contains the reactive gas at a relatively low pressure. The RF energy ionizes the gas and tends to accelerate the ions toward the substrate. The combined effect of accelerating ions toward the substrate and the reactive chemistry of the ionized gas etches the polymer material on the substrate. The major advantage of reactive ion etching as opposed to other plasma etching techniques is that the acceleration of ions toward the substrate tends to result in an anisotropic etch and therefore defines relatively straight side walls on the via holes. The major disadvantage of this technique is that it is relatively slow compared to other plasma etching techniques. This is due primarily to the lower operating pressure of this technique. Typical conditions which can be used for all of the techniques are as follows. Using a Balzers Model 450 sputtering machine with the rotor driven at 13.6 MHZ, reactive ion etching can be conducted on substrates using various masking techniques. In addition, a power level of 1,000 watts, and a gas mixture of 20% $CF_4$ in oxygen at a pressure of 1 mtorr can be used. Under these conditions, an etch rate for typical polymers, such a polyimide or ZTI1004, will be approximately 0.3 micron per minute.

In order to define via holes it is necessary to mask the polymer surface everywhere except where the via holes are desired. In the conventional approach to reactive ion etching, a metal mask is used which is photopatterned by known techniques to leave apertures where the via holes are desired. The metal mask is most commonly applied by sputtering techniques. When the reactive ion etching process is complete, the metal mask is removed by dissolving the metal in an acid.

The major shortcoming of the metal mask is that it requires a large number of processing steps. The metal must be applied by sputtering, a photo resist must be applied, patterned, developed, and the metal etched, and then after the reactive ion etching step, the metal must be removed. This large number of process steps is costly. In addition, if high temperatures occur during the etching process, then the metal forms a vapor barrier which prevents outgasing products from escaping and causes blistering of the polymer.

An alternative approach involves using a photoresist which is applied and patterned with holes in the area where via holes are desired. The photoresist then acts as the mask. The major problem with this technique is that the photoresist must be removed when the RIE process is complete. Heretofore this has been impossible because conventional photresists are cross linked by the high temperatures involved during the RIE process. Where this technique has been used the approach has been to take advantage of the fact that the photoresist is also etched by the process. A race condition is set up where the amount of etching is sufficient to remove the photoresist but not remove too much of the polymer being etched. This approach leaves very little margin for error. Here an invention is disclosed in which a relatively thick layer of photoresist is used. The resist is exposed and developed to open areas where via holes are desired. The RIE process can be continued for a substantial amount of over etching time to ensure a safe processing window. On removing the substrate from the reactive ion etching system a substantial amount of highly crosslinked photoresist will remain. Clearly this cannot be removed by ordinary ashing techniques as they would attack the underlying polymer. In addition, normal photoresist stripping chemicals are usually not effective on highly crosslinked resists and those that are also attack the underlying polymer.

The present inventive technique is to place the substrate in a lapping fixture and lap to the same or a slightly greater degree than was used for lapping the encapsulant. This cleanly removes the photoresist and leaves a new encapsulant surface subsequent the processing steps. In one embodiment of this process, ZTI1004 can be used as the encapsulant material and lapped to within 1 mil of the tops of the chips. A negative photoresist, type F360 available from ChemLine Industries of Lancaster, Pa. is then spun at a speed of 1,500 rpm for a period of twenty seconds. The resist is baked at 100° C. for ten minutes and exposed to 100 mjoule per square centimeter of ultra-violet energy. The resist is developed using a 1% solution of sodium carbonate for approximately two minutes with continuous agitation. At this point reactive ion etching proceeds for a period of $1\frac{1}{2}$ hours as described above. The resist is actually about 1 mil thick as is the encapsulant, but the etch rate of the resist in the 20% of the $CF_4$ oxygen mixture is about $\frac{1}{2}$ that of the encapsulant material. As a result the encapsulant is etched with a substantial margin while the resist is attacked but not completely etched through. When the RIE etch process is complete, the substrate is placed in a lapping assembly and lapped for a period of five minutes using the same lapping conditions as described above for encapsulation. Etch stops either in the pressure plate apparatus or on the substrate itself prevent the lapping process from continuing beyond a predetermined point. This process, while relatively slow for one part, lends itself to batch fabrication processes and requires a minimum number of steps relative to any of the known RIE approaches to forming vias.

2Photo Patterning

This section discloses a novel method of using a photo patternable dielectric material as the encapsulant and subsequently forming via holes in the photo patterning material. In this invention, the photo patternable material is spin coated as described in this section on encapsulation such that everywhere on the substrate it is 2 mil thicker than the thickness of the chip. The photo patternable material is then lapped to a predetermined thickness as set by lap stops on the substrate or on the pressure plates as described in the encapsulation section hereof. The photo patternable material could be any positive or negative acting photo polymer which makes a suitable encapsulant. This material could be a photo patternable polyimide, such as Probimide 413 from Ciba Giegy. In a presently preferred embodiment, a special mixture of Dupont VAQS is used. The VAQS material is primarily intended for use as a solder mask. The specially prepared material is identical to the commercial VAQS material from DuPont with two exceptions. There is no glass filler in the material and the material does not contain a pigment. The preferred formulation of this material is four parts of VAQS base material and one part of the VAQS hardener. To this mix is added two parts by weight of the VAQS thinner material. After thorough mixing, the formulation is filtered with a 3 micron filter and then degassed for fifteen minutes in a vacuum. The dispensing technique is to dispense copious amounts of material in the center and around the edges of the substrate and subsequently spin the substrate for twenty seconds at a speed of 400 rpm. This technique results in complete coverage of the substrate and no formation of voids. The substrate is then placed on a clean room cloth which is placed on a hot plate at 100° C. The clean room cloth tends to absorb any material which has come to the edge of the substrate and prevent the substrate from sticking to the surface of the hot plate. This technique is thought to be particularly novel. The bake process is intended to drive off solvent and is continued to one hour and twenty minutes. During this time significant leveling of the VAQS material occurs. In addition the material becomes sufficiently hard to allow lapping and photopatterning operations. Lapping is carried out as described in the encapsulation section. The material is lapped to a thickness of 1 to 2 mils over the tops of the chips. At this point the material is exposed through a mask using an energy of 100 mjoule per square centimeter. After exposure, the material is developed in a 1% solution of sodium carbonate for a period of two minutes with continuous agitation. At this point clean well formed holes are obtained through the encapsulant material to the pads of the underlying chips. Subsequent to metallization the following post processing is used: Exposure to a flood of UV energy at a total of two joules per square centimeter followed by a thirty minute bake at 150° C.

3-Excimer Laser Ablation

This technique is the presently preferred method for forming via holes in the encapsulant material. It can be accomplished using a Lumonics Laser Machining System available from Lumonics Inc. of Ontario, Canada. Ablation is accomplished on this system by using an aperture which is five times larger than the desired via hole size and imaging this aperture onto the surface of the substrate with a 5× demagnification. The conditions used are 100 pulses at an energy of 70 mjoules per pulse at a wave length of 248 nanometers. The number of pulses at this energy is sufficient to ablate through 3 mils of material. Since only 1.5 mils of material is used this leaves a very wide process window. In addition the laser energy is effectively dissipated by the very high thermal diffusivity of the aluminum or gold circuit pads of the integrated circuits. This prevents these pads from being ablated by the laser energy.

Metallization And Patterning

The preferred method of metallization is sputtering since it gives the ability to clean oxides from the metal pads as well as giving excellent adhesion of metal to polymers. As an example of sputtering, materials prepared as described in the encapsulation and via formation sections were placed in a Balzers Model 450 sputtering system. The following conditions were used: The unit was pumped to a starting pressure of IE-6 torr. Argon was admitted at a pressure of 1 mtorr and a flow rate of 10 cc per minute. The substrates were first RF back sputtered at a power level 1,000 watts for a period of three minutes. This was done to remove oxide from the surface of the metal pads in the vias. Next a titanium target was cleaned at a power level of 2.2 kilowatts using a Magnatron sputtering unit. A cleaning time of one minute was used. Subsequently, titanium was sputtered on the part for a period of eight minutes. This gave a coating of approximately 1,000 angstroms thick. Next, copper was sputtered at 2.2 kilowatts using a Magnatron sputtering head. The copper target was first cleaned for a period of one minute and then copper was sputtered on the substrate for a period of forty minutes. This gave a copper thickness of 2 microns. This was followed by again sputtering titanium to a thickness of 1000 angstroms giving a titanium-copper-titanium sandwich. Two microns of copper is sufficient for a large majority of applications.

An alternative technique, which allows for thicker metallization, is to back sputter for three minutes and sputter titanium for eight minutes as described but then sputter copper for eight minutes also. This gives a copper thickness of approximately two to three thousand angstroms. At this point, the substrate is removed from the sputtering chamber and the copper is built up by electroplating. The cooper is plated to the substrate at a plating current of 35 amps per square foot. Electroplating at the prescribed current density for ten minutes gives a 6 micron thick copper coating. Plating for twenty minutes gives a 12 micron thick coating. Twelve microns is desirable for power supply and certain I/O pad configurations. Once the electroplating has been completed, a top layer of adhesion metal is applied either by electroplating (e.g., chrome) or by sputtering (e.g., chrome or titanium). Titanium sputtering proceeds as described before with a pump down followed by a cleanup for three minutes followed by cleaning the target for one minute followed by eight minutes of sputtering of titanium as previously described.

Patterning is conducted by spin coating a resist, patterning the resist and then etching in suitable etchants. As an example, type AZP4620 resist can be used. This resist is spin coated at 2,000 rpm for twenty seconds, and then dried at 100° C. for ten minutes. This is a positive acting resist which can be exposed through a mask with 200 mjoules per square centimeter of energy. The resist is then developed in a 0.1N solution of sodium silicate. Assuming a metallization of titanium- copper-titanium, the etch process takes place as follows. First, a dip in TFT etch available from Transene Company of Rowley, Mass. diluted twelve to one with water. This etch takes approximately twenty-two seconds. This is followed by a dip in ferric chloride etch solution diluted one to ten in water, which for 2 microns of copper takes one minute. The ferric chloride etch is followed by a rinse and a dip in the TFT etch solution. At this point, the resist can be removed by puddling acetone on the substrate and spinning it dry. In cases where copper migration is a problem, such as high humidity applications, certain additional steps can be taken to dramatically improve humidity capability. These steps involve gold plating all exposed copper surfaces with an electroless gold material. The substrate is first dipped in a 5% solution of citric acid for one minute followed by electroless gold plating in a solution at 50° C. for a period of ten minutes. This gives a sufficiently thick coating of gold to prevent copper migration in the presence of moisture. This technique of coating exposed copper area with gold to improve humidity performance is believed to be particularly novel.

Fabrication Of Additional Interconnect Layers

Additional interconnect layers are fabricated by spin or spray coating a dielectric material onto the module, forming via holes, applying metallization, and patterning that metallization. The only step which has not been described above is the step of applying a new dielectric layer. In the case of epoxy this is done as follows. The epoxy material is dipped in a concentrated sulfuric acid solution for a period of ten seconds followed by a thorough rinsing for one minute in DI water and spin drying or hot propanol drying. At this point, ZTI1004 is spin coated at 3,000 rpm and UV cured using an energy of one joule per square centimeter. Following the UV curing, via holes are formed by excimer laser and metallization is added and patterned. A post bake of the dielectric material can be done either before or after metallization and patterning. Clearly, the process is speeded up if for each dielectric layer there is no post bake, i.e., until the end of the process.

An alternative interlayer dielectric is to use the above-described VAQS material from DuPont specially modified to eliminate glass filler and pigment. This material is spin coated at a speed of 2,000 rpm, dried for ten minutes at 100° C. and then photo exposed with an energy of 100 mjoule per square centimeter. Material is then developed in a solution of 1% sodium carbonate for a period of two minutes. Post curing is achieved by exposure to two joules per square centimeter of UV energy, followed by a twenty minute bake at 220° C.

III. VARIATIONS IN THE BASIS AMCM STRUCTURE AND METHODS

In this section various variations to the basic structure will be disclosed which allow for optimization or improvement in a particular area. In particular, this section will cover structures and methods for input output, connection to the next level, optimization for high speed, and repairable and hermetic structures.

Preprocessed Circuits For Input Output Power Distribution And Other Special Purposes Those skilled in the art will recognize that integrated circuits are not the only type of electronic component that can be interconnected by this technology. In this section specially fabricated structures are disclosed which can be incorporated on the substrate and interconnected along with the rest of the ICs on the substrate, to add to the overall functional capability of the multichip module. The advantage of this approach is that special processing can be conducted separately on the preprocessed circuits, and the advantage of that special processing can be enjoyed by the multichip module. By way of example, four preprocessed circuits and their incorporation in the basic AMCM will be discussed. These are flexible tab interconnect, wire bond lands, leadframe assembly and power distribution system.

Figure 9:
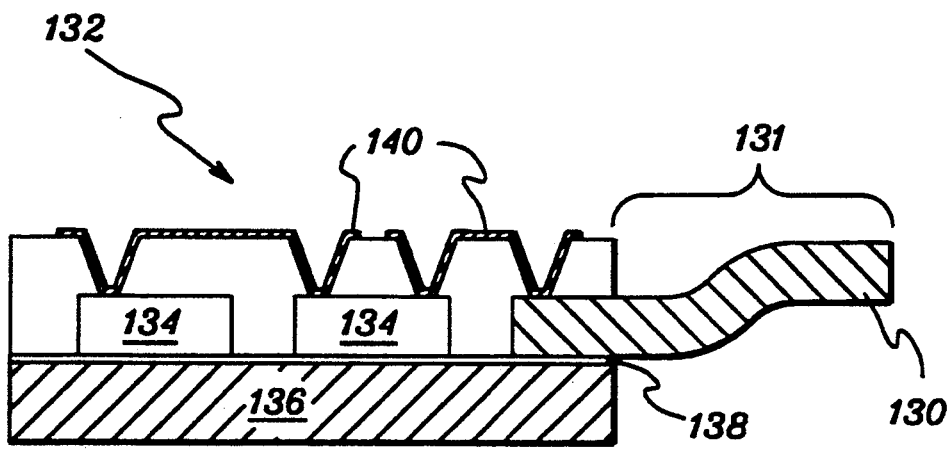
FIG. 9 is a cross-sectional elevational view of a multichip integrated circuit module having a preprocessed flexible tab incorporated therein.

FIG. 9 shows a cross-section elevational view of a flexible tab 130 incorporated in the basic advanced multichip module 132. The basic flex circuit is of a type available, for example, from Sheldal Incorporated. Many such flex circuits can be fabricated at one time and subsequently cut into appropriately sized strips. These strips when incorporated in the multichip module can be used as a flexible high I/O count interconnect for connecting the multichip module to a printed circuit board, for example. The preprocessed flex interconnect 130 is incorporated on the multichip module at the same time the chips 134 are placed on the substrate 136. The tab interconnect is adhesively bonded 138 to the substrate base 136. The top surface of the tab interconnect is essentially planar with the top surface of the integrated circuit chips (see FIGS. 10a and 10b). In this way, circuit layers 140 that interconnect the integrated circuit chips can simultaneously provide interconnect to the input output tab.

Figure 10A:
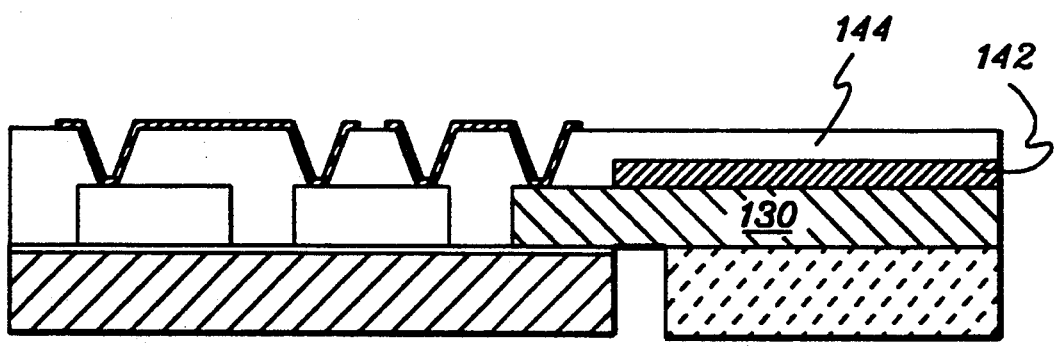
FIG. 10a is a cross-sectional elevational view of the module of FIG. 9 during an intermediate step in the fabrication thereof.
Figure 10B:
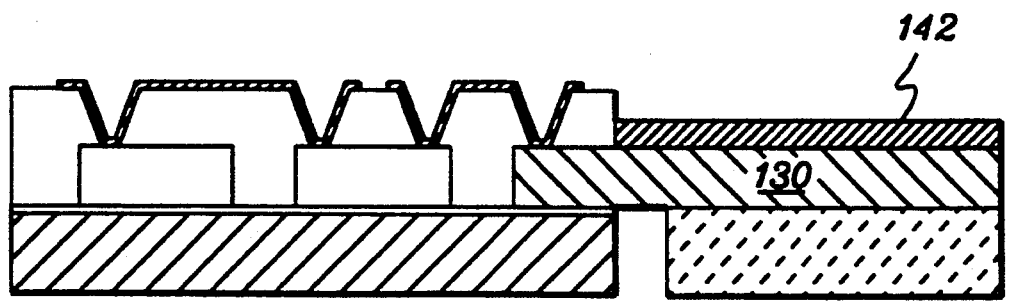
FIG. 10b is a cross-sectional elevational view of the module of FIG. 10a after selective excimer ablation of the polymer.

Care must be taken to provide a means for keeping the outer portion 131 of the tab 130 free of encapsulant and dielectric material, and protected throughout the processing. This can be done by depositing a layer of metal 142 to a thickness of approximately 1 micron and patterning that metal over the area where protection is desired. The processing then continues as described above with the result that the entire surface of the tab is covered with the encapsulant polymer 144. These can subsequently be removed by excimer laser ablation. The excimer ablates the polymer 144 but stops when it encounters the deposited metal 142 (see FIG. 10b). If the deposited metal is chosen properly it can easily be removed by a differential etch. For example, typical materials for tab bonding systems are copper conductors with either gold or solder pads for the actual connection. Aluminum can be deposited by either vapor or sputter deposition techniques to a thickness of 1 micron, and can easily be removed in a basic etch such as 5% sodium hydroxide. This will not attack solder, gold or copper but will etch the aluminum in under one minute. Again, FIGS. 10a and 10b show the process at different stages. FIG. 10a shows the substrate after encapsulation, via formation, and metal patterning applied as described in the previous section. FIG. 10b shows the part after excimer ablation of the polymer. FIG. 9 depicts the finished product after selective etching of the aluminum metallization.

The addition of the patterned aluminum protection layer can be achieved as follows. An array of processed tab circuits is placed in the Balzers 450 sputtering unit. After a thirty minute pump down to 1E-6 torr., argon is admitted to the chamber to a pressure of 1 mtorr. The aluminum target is cleaned by sputtering at 2.2 kilowatts for a period of one minute. Then aluminum is sputtered on the array of tab interconnects for a period of thirty minutes, which gives a coating thickness of 1 micron. The aluminum is then patterned by spin coating AZP4620 resist at 2,000 rpm for a period of twenty seconds and then baking the structure in an oven for a period of twenty minutes at 95° C. Exposure conditions are 120 mjoule. Development is in 1% sodium silicate for a period of thirty seconds. The aluminum is etched in a 2% sodium hydroxide solution and the resist removed by a dip in acetone for one minute followed by a dip in hot methanol for one minute. The tab circuit is then allowed to dry. At this point, individual tab circuits are cut from the array using conventional shearing techniques.

Figure 11A:
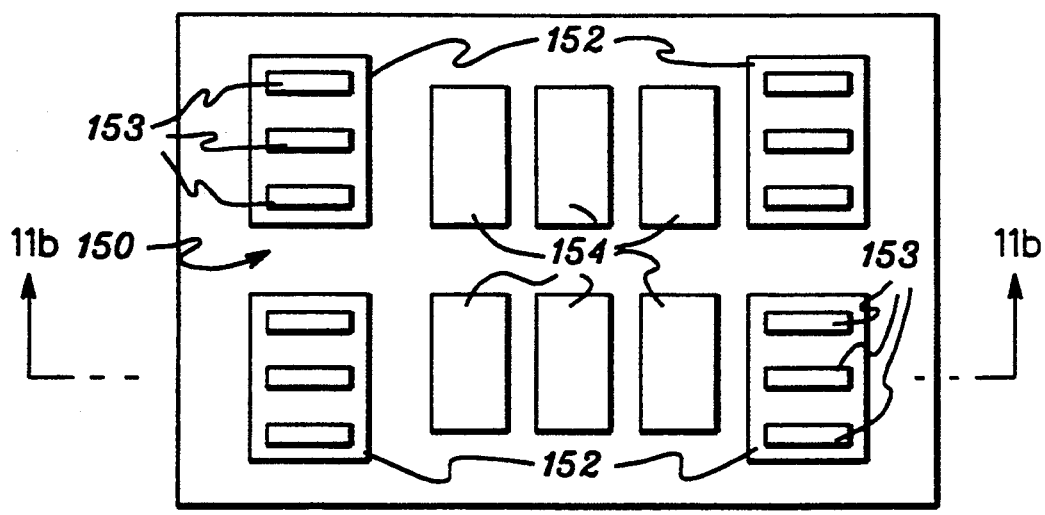
FIG. 11a is a plan view of a substrate with integrated circuit chips and preprocessed chips having wire bond lands, pursuant to one embodiment of the present invention.
Figure 11B:
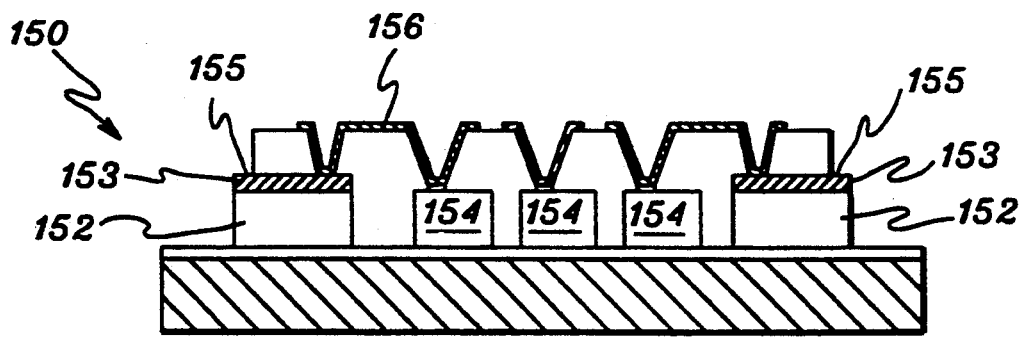
FIG. 11b is a cross-sectional elevational view of the structure of FIG. 11a taken along lines b—b and after encapsulation and metalization thereof.

A second example of a preprocessed circuit is a series of lands for wire bonding. These circuits are fabricated in a batch process and sawed or laser scribed in the same way as integrated circuit chips. They are placed during the die attach process and subjected to the normal processing steps. Typically, an alumina substrate is used with aluminum deposited to a thickness of 1 to 2 microns, and patterned to form landing areas for wire bonding. Figures 11a and 11b show plan and cross-section elevational views of the module 150 with the wire bond lands 152 and landing areas 153. Note that electrical connection 156 is made by the exact same processing that makes electrical connection to the pads of the integrated circuit chips 154. Note also when the processing is complete, an excimer laser is used to remove the polymer material from the area 155 where wire bonding will take place. Using this technique separates the efforts of preparing the wire bond land and preparing the module into two more efficient tasks, since a multiplicity of wire bond lands 152 can be processed at the same time and used on a large number of multichip modules.

Figure 12:
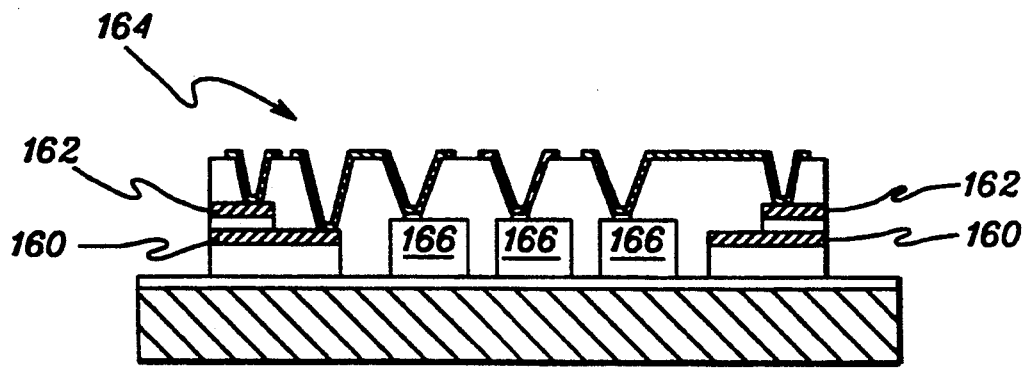
FIG. 12 is a cross-sectional elevational view of an AMCM structure pursuant to one embodiment of the present invention incorporating a two layer power and ground preprocessed chip.

FIG. 12 shows a third example of a preprocessed circuit. This is a two tiered power and ground distribution system. Again the power and ground strips 160 and 162 are fabricated separately from the fabrication of the advanced multichip module 164. Relatively complex power and ground busing structures can be fabricated to allow for a substantial number of layers of power and ground busses 160 and 162 made with thick conductor material. These are again placed at the same time the die 166 are placed and can be used to provide stiff power and ground distribution of a number of power levels without increasing the number of signal layers which are required. In particular, this invention allows signal layers to provide interconnection pathways above the power and ground distribution circuits.

Area Array Input Output Structure And Methods

This section describes the process steps necessary to create a structure over the top of the basic advanced multichip module structure which can be used to directly connect from the multichip module to the next interconnect level. The next interconnect level can, for example, be a simple conventional printed circuit board. A structure is provided in which the entire top surface of the multichip module can be covered with an array of input output pads which make contact to circuitry in the multichip module. Connection from this array of pads can be made to a conventional circuit board by using, for example, button contacts available from Cinch Incorporated.

Figure 13:
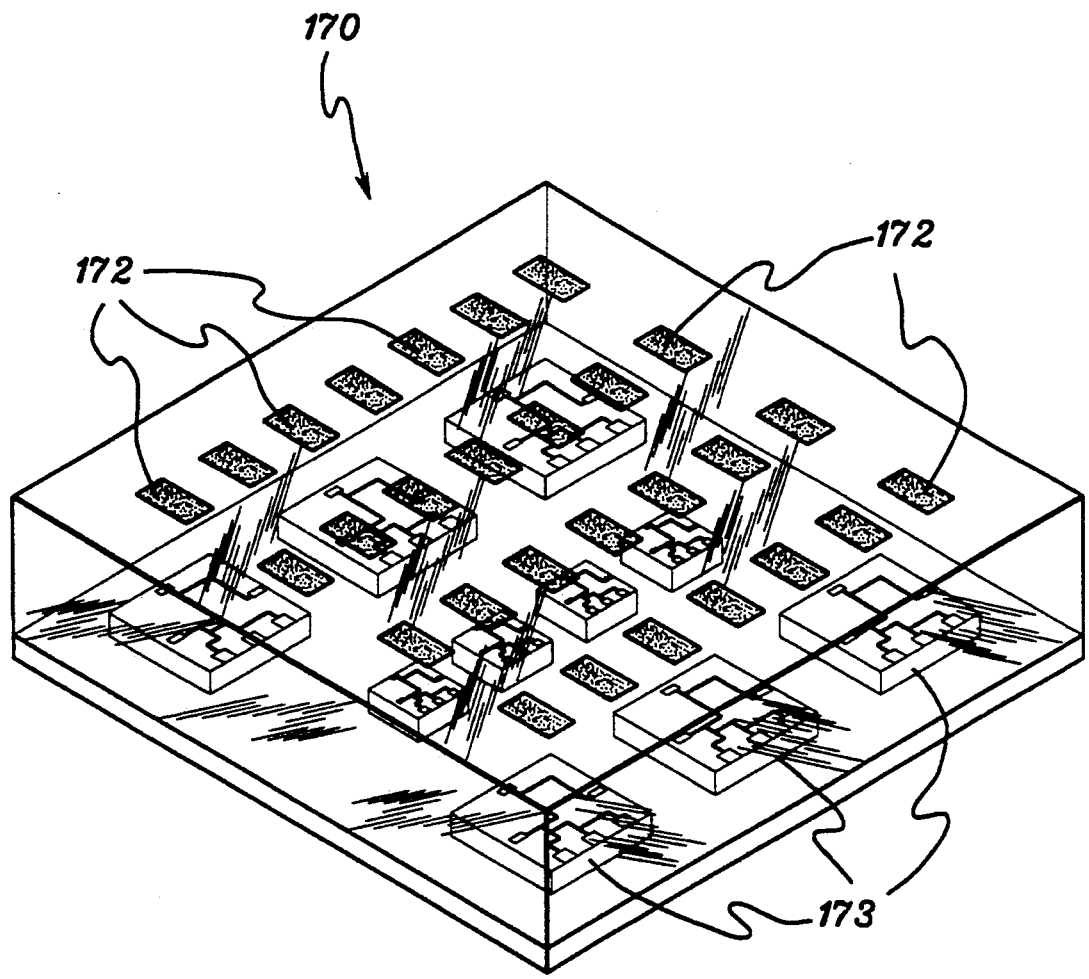
FIG. 13 is a perspective view of one embodiment of the present invention wherein an AMCM with an area pad array is shown for electrical interface to an external circuit (not shown)
Figure 14:
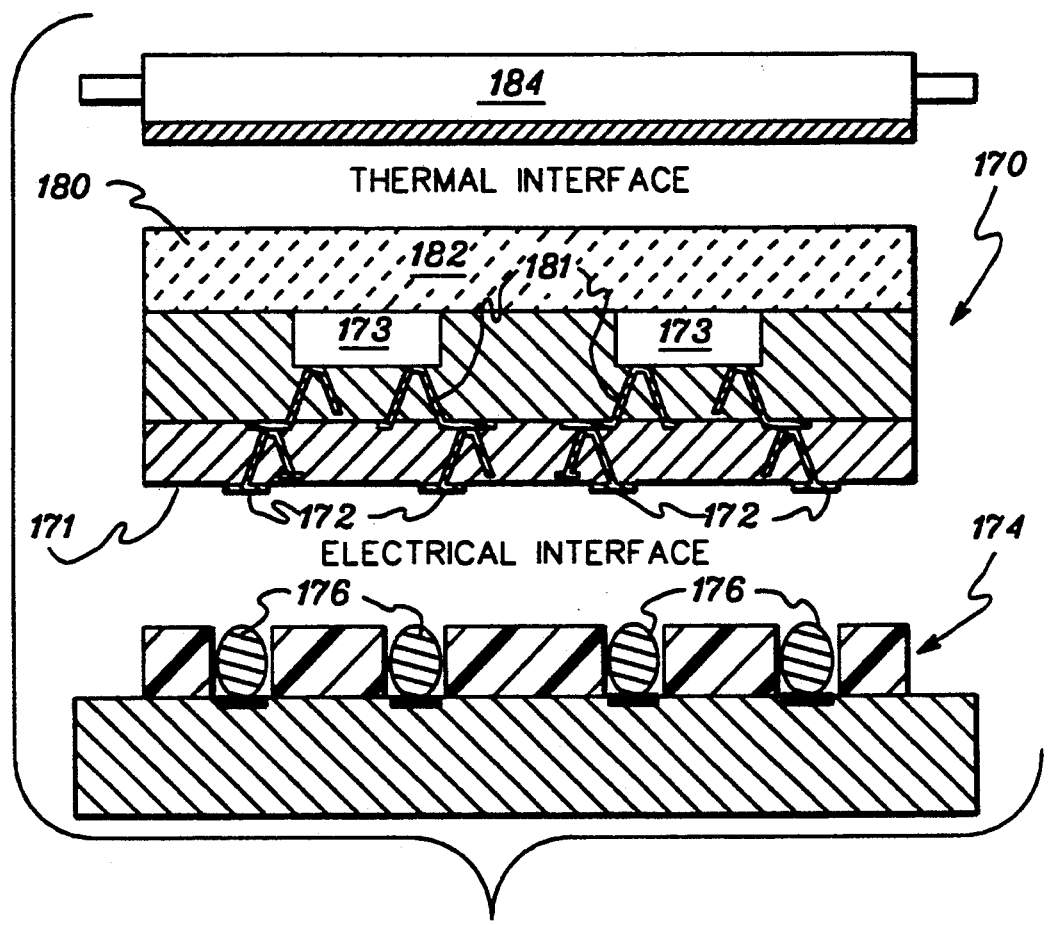
FIG. 14 is a cross-sectional elevational view showing the structure of FIG. 13 oriented upside down and positioned in electrical interface with a conventional printed circuit board, using button contacts, and thermal interface to a heat sink.

Before continuing the discussion of the specific disclosed structure and methods it is helpful to review the known prior art. Button contacts are intended for interconnection from one circuit board to another circuit board or for interconnection from a package containing an integrated circuit to a circuit board. The particular advantages of the disclosed structure are that the input output pads can cover the entire top surface of the multichip module. For example, FIG. 13 shows an area pad array structure 172 incorporated in the multichip module 170. FIG. 14 shows this structure in a cross-sectional elevational view making connection to a conventional printed circuit board 174 using button contacts 176.

An aspect of the invention which is thought to be novel is the ability to provide the array of input output pads 172 over the entire top surface 171 of the module 170 without requiring any special separate areas to accommodate the interconnected components of the module. Specifically, in a printed circuit board, areas are set aside for interconnect of the components with wiring to peripheral areas of the circuit board where the button contacts are provided. In the disclosed structure, pads are placed directly over the interconnected components 173. If, for example, the overlay type approach were used for this structure, pads placed between components could not accommodate the forces of the button contacts because the bridging between adjacent electrical components does not render the structure capable of supporting the button contact forces.

Another aspect of the disclosed invention which is believed novel is the ability to provide contact pads having a very short interconnect length to the electronic circuitry. Typically, the distance from a pad to the associated interconnected electronics is on the order of several mils. The wiring lengths required in systems where the pads and the components are separated must necessarily be large fractions of an inch (boards with pads on periphery of components).

Another novel aspect of the structure is that the I/O pad array which makes interconnection to the circuit board is on one side of the module while the surface of heat removal is on the other side. This can easily be seen in FIG. 14. Since the chips are mounted directly on a flat substrate heat can be easily removed through the opposite side 180 of the substrate 182. This is detailed in an earlier part of this disclosure. The novel aspect of the structure of FIG. 14 is that heat removal takes place in a direct path from the chips 173 through the substrate 182 to a heat sink 184 while input output takes place in a direct path but in the opposite direction from the chips 173, to interconnect 181, to input output pads 173. Circuit board approaches preclude direct thermal connection on the same side as the input output. As a result, in other structures either the input output distance must be sacrificed or a minimum thermal path length to the heat sink must be sacrificed.

Another novel aspect of the presently disclosed structure is the ability to provide and make contact to internal test points. The ability to contact internal test points has been used extensively in testing conventional circuit boards. So called bed of nails testers make contact to pads connected to circuit runs on all points of a printed circuit board. This capability is of great value both for observing the internal nodes, overriding logic signals on internal nodes, and providing unique stimulus in order to speed up or even enable testing of certain systems. Until this invention, this ability has not been available in multichip modules. In the "chip on board" approach, two factors preclude its use. First, if the chips are closely spaced there is insufficient area to provide large numbers of contacts to a bed of nails type probing arrangement. Secondly, the dramatically reduced size of all multichip modules relative to conventional circuit boards means that the bed of nails type probe devices are unable to provide contact within the space allotment. In the disclosed invention, since pads 172 can be provided over the entire top surface 171 these pads can be used to connect to internal nodes of the multichip module wiring 181. As described earlier, button contacts 176 are used to provide temporary interconnect between these pads and a conventional circuit board 174. In this way a very compact test head can be provided which provides the same function for multichip modules as bed of nails probing provides on conventional circuit boards.

This section describes the additional processing steps necessary to provide the pad array structure discussed above. The structure is capable of direct interconnection to a conventional printed circuit board through the use of button contacts. The area array of pads can be provided over the entire surface of the multichip module including the area both above and adjacent to the electronic components. Additionally, the input output interface and the thermal interface are both optimized and positioned on opposite sides of the multichip module. The processing steps of providing a substrate, covering the substrate with a die attach material, accurately attaching die which are thinned, encapsulating those die, providing holes through the encapsulation to the pads of the integrated circuit chips, metallizing, and patterning the metallization to provide interconnection between the integrated circuit chips has been disclosed above. The following additional steps are necessary in a given layer of the interconnect in order to provide input output pads in a array form which can cover the entire surface of the multichip module.

After the appropriate number of interconnect layers has been provided, a layer of dielectric is applied to the module by spin or spray techniques. ZII1004 can be used at a spin speed of 2,000 rpm for a period of twenty seconds. This material is then cured under UV light with an energy of 2 joules per square centimeter. The material is postbaked at 150° C. for five minutes and 220° C. for a period of twenty minutes. Following postbake, via holes are formed to the interconnect layer beneath using an excimer laser as described previously. Metallization is applied (as describe earlier) in which titanium is sputtered to a thickness of 1,000 angstroms and copper is sputtered to a thickness of 3,000 angstroms. At this point, the module is removed from the sputtering chamber and coated with a thick coating of photopatternable resist. A negative acting resist type F360 can be used. This material is available from Chem Line Incorporated. The resist is spun at a speed of 1,500 rpm for a period of twenty seconds. The resist is then baked for twelve minutes at 100° C., and subsequently patterned using an exposure energy of 100 mjoule per square centimeter and a development time of 100 seconds in a 1% sodium carbonate solution. This process leaves the area where pads are desired exposed. Electrical connection is then made to the metal of the substrate and electroplating of copper proceeds. An electroplating current of 35 amperes per square centimeter is used for a time of forty minutes to achieve a total thickness of electroplated copper of greater than 12 microns.

It should be noted that the thickness of copper is important to this invention. The copper thickness must exceed 12 microns in order that the contact forces associated with the buttons be dispersed over the entire surface area of the contact pad so that the polymer underneath does not obtain a permanent set and eventually reduce the forces between the pad and the button contact. The permanent set can also punch through dielectrics and short underlying layers. After copper plating, the assembly is plated in a nickel bath to build up the thickness of nickel to approximately 100 micro inches and to provide a barrier between the nickel and the gold which will subsequently be plated. After nickel plating, the substrate is rinsed and placed directly in an acid hard gold palting bath. Gold is plated to a thickness of at least 50 micro inches. After the gold plating, the resist is removed by dipping the substrate in a 5% ammonium hydroxide solution for a period of one minute. The substrate is rinsed and placed in a copper etch consisting of one part ferric chloride and ten parts DI water. This etch takes place for a period of twenty seconds to remove the background copper and leave only titanium exposed. The titanium is etched in a one to twelve solution of TFT etch available from Transene Corporation. At this point, an environmental coating is added which coats the entire top surface of the module except for openings provided above each input output pad.

It should be noted that the metallization described here is no different than the other metallizations in the multichip module except that it is typically thicker and covered with nickel and gold to give the highest reliability contact. This metallization layer can be used to provide additional interconnect capability. Specifically by leaving a small gap around each pad and then providing metal everywhere else, this layer can be used both for input output pads and for distribution of power and/or ground. Alternatively, the layer can be used to provide additional interconnection capability not provided in the layers beneath. The environmental coating is used to protect this layer and also to allow the existence of power and ground on this surface without the danger of shorts to other structures. Environmental coating can be supplied by using VAQS especially prepared as disclosed above. Spin coating at a speed of 2,000 rpm for a period of twenty second and baking and patterning is also accomplished as described earlier.

In a second alternative for environmental coating, an opaquing coating may be used. In sensitive electronics light can create photocurrents which cause improper operation of the electronics. To prevent this an opaque environmental coating is used. This coating consists of a pigment filled material; for example, black pigment in SPI 129. This mix is spin coated at 1,000 rpm and baked at 100° C. for 10 min., 150° C. 10 min., and 220° C. for 30 min. Openings to the gold I/O pads are formed by excimer laser using an aperture slightly smaller than the pad size and pulse rates and energies as previously disclosed.

Optimization For High Speed

Figure 15:
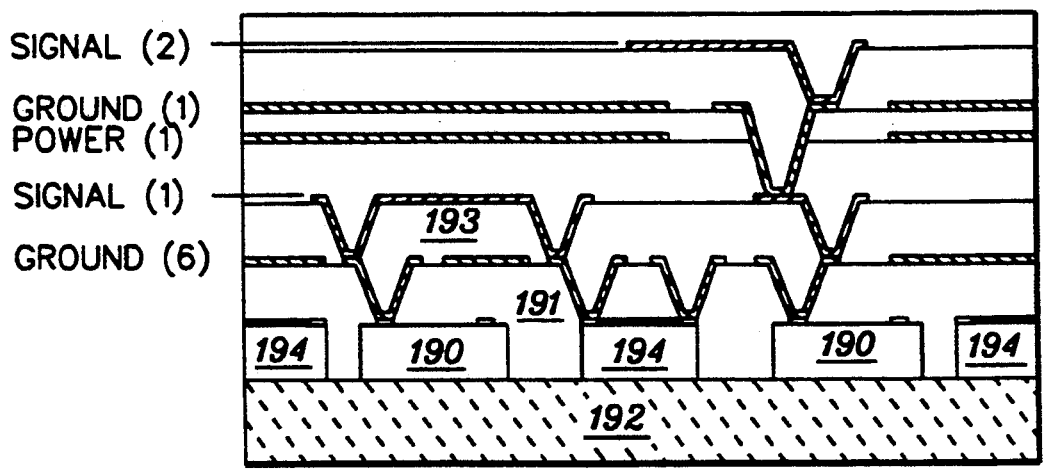
FIG. 15 is a cross-sectional elevational view of one embodiment of a speed optimized AMCM circuit pursuant to the present invention.

FIG. 15 is a cross-sectional elevational view of a speed optimized advanced multichip module. The following discussion centers on those aspects of the advanced multichip module which together define a structure capable of very high speed operation. In some cases, the inherent structure of the basic advanced multichip module allows operation at very high speed. In other cases, particular novel structure variations provide enhanced or improved speed capabilities.

An aspect of the basic structure of the invention is the ability to provide impedance controlled interconnect in combination with very efficient heat removal. Referring to FIG. 15, in the depicted structure it can be seen that the chips 190 are mounted directly on the substrate 192. As described before, the die attach glue line (not shown) is very thin and can be made thermally conducting by filling it with diamond powder or silver powder, depending whether thermal or both thermal and electrical conductivity are desired. The chips are thinned so that the thermal drop in the integrated circuit material is also reduced by the ratio of thinning. Typically, 21 mil chips are thinned to 7 mils which gives a 3 to 1 reduction in thermal resistance of the chip material. Finally, the actual substrate base plate 192 for the multichip module can be chosen to be highly thermally conductive. For example, aluminum nitride has high strength, and good thermal expansion match between silicon and GaAs. Copper clad molybdenum offers custom tailored thermal coefficient match as well as improved heat spreading due to the copper and a conductive substrate to provide ground reference for high speed circuitry.

At the same time that the structure provides ideal thermal interface for chips, it is inherently capable of providing an impedance controlled strip line and microstrip line connections directly to the pads of the chips with no discontinuity in the signal path. Systems which build a miniature circuit board are capable of providing the controlled impedance strip line and microstrip line, but no matter how chips are mounted on this circuit board the thermal interface is not optimum. If chips are mounted directly on the circuit board, heat must be removed through the dielectric layers on the miniature circuit board. This presents a substantial thermal resistance. If the chips are mounted in the flip chip fashion, a special complex system must be provided for contacting the backside of the chips and removing heat.

Specifically, in FIG. 15 two signal layers are shown demonstrating the inherent capability of the structure to provide micro strip and strip line. Note that the encapsulant material is extremely flat and forms a parallel plane with the surface of the active chip area. In the circuit of FIG. 14 the following typical spacings are used to provide a 50 ohm matched impedance interconnect. For the first conductive layer, a more or less uninterrupted conductor is provided to form a shield layer, i.e., Ground (0). This layer provides two functions. First, it prevents any capacitive coupling between the Signal (1) line and the interconnecting lines on the chips themselves. Secondly, it presents a completely electrically uniform surface to the signal line so that the Signal (1) line does not see discontinuities between the ground field associated with chips 190 which appear to be at ground potential and the dielectric 191 between chips 190 which appears to be an electrically high impedance.

The next layer in the structure is the dielectric between the shield layer, Ground (0) and the Signal (1) layer. For absolute optimum performance this layer is configured to be between Signal (1) and the shield layer and thereby allow Signal (1) to approximate a micro strip configuration wherein the second dielectric is thinner than the first dielectric. This allows Signal (1) to be wider at 50 ohm impedance, thereby reducing copper losses associated with a less wide run. Typical width of Signal (1) lines for optimum performance will be approximately 25 microns. A typical thickness of dielectric 193 is approximately 20 microns. The spacing between Signal (1) lines is approximately 75 microns. This provides low levels of cross talk between adjacent lines as well as an approximately 50 ohm characteristic impedance associated with the strip line. The line resistance of this structure, given a copper thickness of 5 microns, is 5 ohms per inch. This allows several inches of line length before line losses become significant. These typical values are given assuming a dielectric material with a dielectric constant of approximately three, such as ZTI1004.

A very low impedance power and ground can be provided in the structure as shown. Power (1) and ground (1) conductors are essentially in uninterrupted planes with exceptions for vias from the layers above. Very low inductance is achieved in the power and ground planes by decreasing the dielectric thickness between power (1) and ground (1). It is important to note that because the structure is extremely flat and planar it is possible to apply a very thin coating of dielectric material which is pinhole free. In the HDI overlay approach, nonplanarity at the edges of chips causes thinning of dielectric between power and ground. To handle the high currents usually associated with devices operating at very high speeds, the power and ground plane are built up by electroplating copper to thicknesses of 12 to 20 microns. This gives ground plane resistance related voltage drops on the order of less than 50 millivolts for 100 amps current. Additional transient stabilization of the power and ground plane can be achieved by increasing the dielectric constant of the dielectric that separates power (1) and ground (1). This is done by filling the dielectric material with a high K dielectric powder such as bariumtitanate or titanium dioxide. Using bariumtitanate mixed 50/50 by weight with ZTI1004 should give a dielectric constant of 115 in 5 micron thick dielectric coating. This results in a capacitance of 0.1 microfarads per square centimeter. It is extremely important to note that this level of capacitance is more than sufficient to provide capacitive decoupling of power supplies at very high frequencies. As a result, there is no need for distributed capacitance in this structure. This is due entirely to the fact that the power and ground planes have low inductance and contain a built in distributed capacitance in this structure. This is extremely important because the inductance associated with most bypass capacitors is such that the effective impedance of the capacitors render them useless at very high frequencies. This structure is unique in that power delivery impedance is very low, along with inductance due to the closely spaced ground plane and the extremely short distance from the power plane to the pads of the chip. In addition, the capacitance (via power and ground planes) is built into the structure and therefore of very low impedance. The use of a power ground plane in the "circuit board over chip" configuration which uses a thin dielectric of high relative permittivity is thought to be novel. Further, as described below, resistor termination arrays 194 are incorporated into the embodiment of the module to terminate lines in their characteristic impedance.

Incorporation Of Thick Chip Components

The disclosed power ground structure provides the most effective means of high frequency bypassing of circuitry on the module. However, it is still necessary to provide energy storage for stabilizing the inductance of lead wires which supply power to the module. Ideally, these storage capacitors would be of as high a value as possible. It is also desirable, however, to have a relatively thin module typically with a substrate thickness of 25 to 50 mils and a chip thickness of 6 mils. If chip capacitors were treated as ordinary IC components they would have to be only 6 mils thick. This is substantially thinner than commercially available chip capacitors. The following structure (depicted in FIG. 16) and method discloses an enhancement of the basic advanced multichip module structure which accommodates thick capacitors 200 or other conventional chip components such as crystals 202 and inductors 204 while still maintaining complete planarity of the system. In this approach, holes are cut completely through the substrate base 206. These holes are slightly larger (by the tolerance of the size of the component) than the capacitor 200 or other component involved. Laser Services of Westford, Mass. will laser cut holes in substrates for a nominal fee. Alternatively, high power $CO_2$ laser machining systems can be used.

The process starts in a normal fashion with die attach material (not shown) coated on the substrate 206 and die 208 (and resistors 209) placed and cured. At this point, the substrate is turned upside down on a flat soft surface (not shown). Thick components to be accommodated are placed in each of the holes provided in the substrate. A dot of UV curable material 201, such as ZTI1004, is dispensed either by hyperdermic needle or commercial dispensing equipment into each of the holes. The material is subsequently cured using 2 joules per square centimeter of UV energy. This holds the thick components in place so that the top of the thick components are even with the tops of the IC chips. Platers tape or other method of sealing the back of the hole is then used to close off the back of the hole temporarily, and the encapsulation process described in the section on encapsulation is accomplished with the net effect that the entire thick component is encapsulated with encapsulation material filling the hole. The platers tape can then be removed and the process continued in exactly the same way as described in the other processing steps. Via holes can be formed down to the thick component, metal 210 is deposited and patterned to make connection between the component and other interconnects to the ICs and I/O of the system. Such an assembly is shown in FIG. 16. Note now that the thickness of the component 200 can be as great as the thickness of the thinned IC chips 208 plus the total thickness of the substrate base 206. Commercially available capacitor and resistor components are available in thicknesses from 20 to 50 mils and therefore these components can easily be accommodated in this invention without impact on the planarity of the system.

Also as shown in FIG. 16, crystal 202 and coil 204 are accommodated within wells 203 and 205, respectively, in the backside of substrate 206. Laser drilled holes are provided in substrate 206 and filled with a conductive material 212 to the components 202 and 204 to the upper surface of substrate 206 and thereby, the patterned metallization 210.

Termination And Other Resistor Elements

In very high speed systems it is necessary to provide termination resistors and often series and pulldown resistors. Two novel methods for providing termination resistors are disclosed below. According to the first method, resistors are preprocessed on an insulating substrate which is the same thickness as the thinned chips. The substrate is cut into sections which can be placed when the chips are placed and typically arrays of termination resistors are placed in the space between adjacent chips. These resistor arrays can be provided with power bus interconnections such that the ground side of any array of termination resistors can be preconnected and requires only one power connection for the array. This simplifies the wiring associated with the circuitry above the chips. It also separates the termination resistor processing steps from the multichip module processing steps, and allows each process to be optimized. Thousands of resistor arrays can be processed at one time and the diced arrays can be placed where required in a system. FIGS. 17a-17c show a resistor array 220 with one end of each resistor 221 bussed 222. Resistor 221 includes a substrate 223 upon which is positioned the resistive material 224, bus 222 and discrete pads 226. FIG. 15 shows incorporation of termination resistors in the speed optimized advanced multichip module.

Figure 18A:
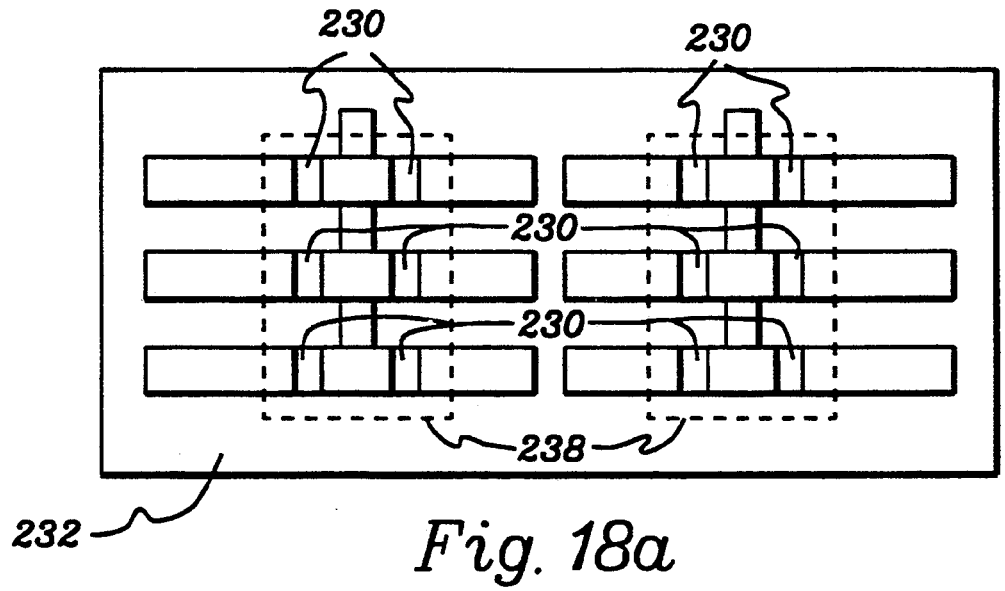
FIG. 18a is a plan view of another embodiment of a resistor array assembly pursuant to the present invention.
Figure 18B:
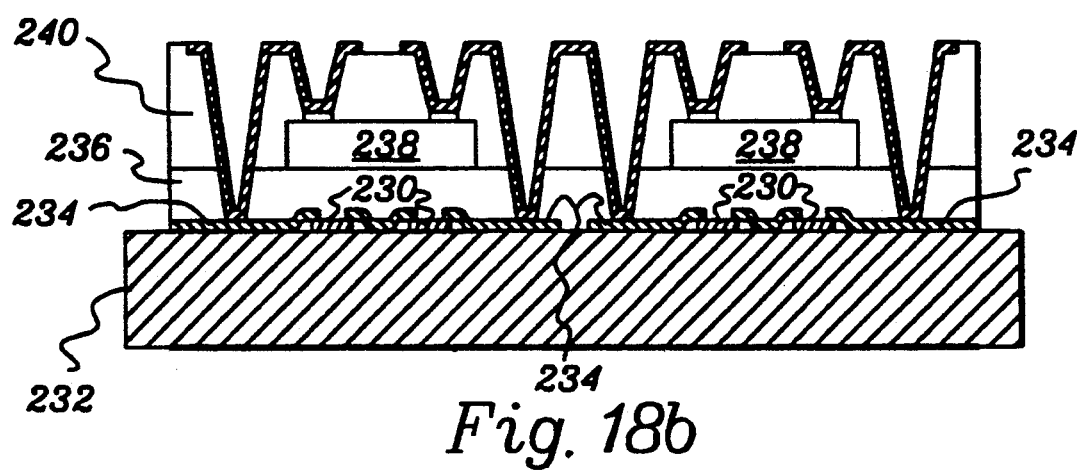

An alternative method (see FIGS. 18a and 18b) is to sputter a resistive material 230 on the starting substrate 232, pattern resistors as appropriate with the conductor leads 234 placed so that they will terminate in the spaces between chips. A thin insulating material 236 is then coated over the resistors. This is followed by the die attach material and the subsequent placement and curing of the die 238 in place. After the encapsulant 240 has been applied and planarized, via holes and metallization are formed to the pads of the chips and between chips to the termination resistor contact pads on the surface of the substrate base plate 232. This configuration is shown in FIGS. 18a and 18b.

Repairable Structures And Methods

Figure 19:
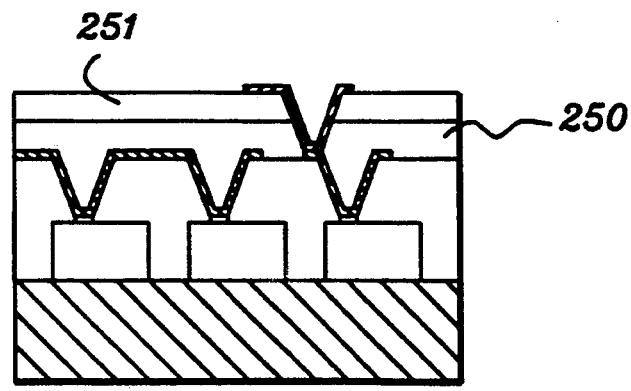
FIG. 19 is a cross-sectional elevational view of an AMCM having a solvent-sensitive layer for circuit repair pursuant to the present invention.

A particular distinguishing characteristic of the advanced multichip module structure is that it can be provided in a repairable form. FIG. 19 shows the basic AMCM with repair capability. Processing of the basic AMCM continues as normal through chip placement, encapsulation, planarization, via formation and metal deposition and patterning for the first interconnect layer. At this point, a solvent sensitive dielectric layer 250 is applied either by spin coating or spray techniques. This structure is shown in FIG. 19. Solvent sensitive layers which can be used include SPI129 which can be spin coated at a speed of 3,000 rpm for a period of twenty seconds and baked ten minutes at 100° C., ten minutes at 150° C. and twenty minutes at 200° C. Another material that melts at a specific melting point is Ultem ® resin available from GE Company. This resin can be applied by spin coating using the mix shown in Table 2.

TABLE 2

| 10 gm Ultem 1,000 Resin | GE Company |
|---|---|
| 35 gm NMP | Baker Chemical |
| 25 gm Methylene Chloride | Baker Chemical |

The same cure schedule as used for SPI129 can be used. Finally, any appropriate material which has a softening point at 300° C. can be used. Such a material is Probimide 200 available from Ciba Giegy. This material has a low dielectric constant and essentially will not melt at any normal operating temperature. Probimide 200 is deposited from a 15 percent mix of the basic polymer and Gama Butyro Lactone. Once the given solvent sensitive layer 250 has been applied, a second dielectric layer 257 can be applied s described previously. Via holes are formed, also as previously described, and metallization is applied and patterned.

If it is necessary to repair the circuit, then the second layer is removed. This can be achieved in one of three different ways. In the first way, the substrate is heated above the melting point of the solvent sensitive layer. At this point the circuit layers above can be peeled off leaving behind remnants of the solvent sensitive layer and the first layer interconnect. In the second alternative, the solvent sensitive layer can be soaked at room temperature in the solvent. This lifts off all layers above the first interconnect layer. The third method, which is presently preferred, involves lapping the substrate in exactly the same way as described in the encapsulation section. This removes both the polymer and all interconnects including the first level interconnect.

Figure 20A:
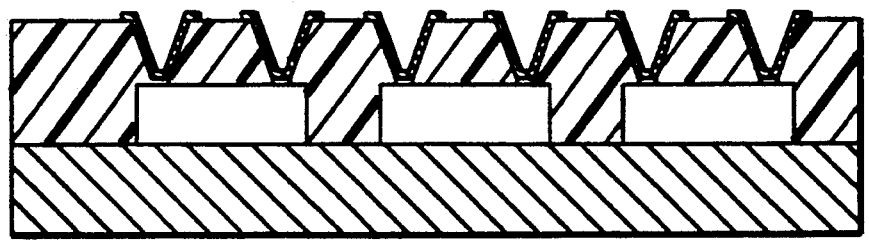
FIGS. 20a–20d are cross-sectional elevational views of an AMCM at different stages during the module repair process pursuant to the present invention.
Figure 20B:
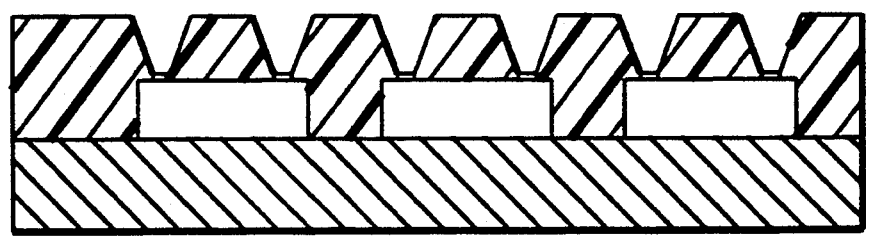

In all cases, the residual solvent sensitive layer is removed by a cleanup process which involves dipping the substrate in the appropriate solvent (FIG. 20a). This is followed by etching the metallization in an etch which attacks the interconnect metallization but does not attack the metallization on the chips (FIG. 20b). As an example, if titanium-copper-titanium metallization is used, then the titanium can be removed using buffered pad etch which attacks the titanium but does not attack the aluminum of the chip pads. The copper can be removed by nitric acid, which attacks the copper but does not attack the aluminum of the chip pads, and the bottom titanium layer can be removed by buffered pad etch available from Ashland Chemical Company of Columbus, Ohio. This leaves behind chips which are encapsulated with via holes without any metallization going to the pads of the chips.

Figure 20C:
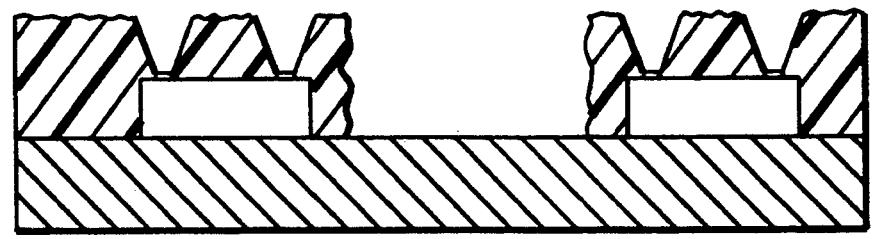
Figure 20D:
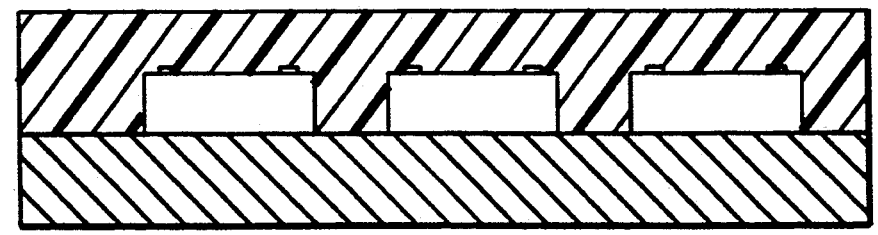

In all cases, the procedure from this point is the same. If the interconnect itself was defective, then a new interconnect is started and processing proceeds in exactly the fashion described above. If a defective chip must be replaced, then the encapsulant is first removed from around the chip., the substrate heated to the softening point of the die attach material and the chip pulled out (FIG. 20c). Once the chip has been removed, all surfaces are cleaned up by mechanical abrasion in the die attach area under the defective chip, i.e., if necessary. This is followed by a relatively extended plasma etch step which plasma etches the surface of all polymer areas, including the surface above the encapsulant and the edges of the encapsulant where the defective chip was removed. At this point die attach material is deposited in the area where the chip was removed and a new chip is placed and cured in place. New encapsulant material is now deposited over the surface of the entire substrate as described in the encapsulation section hereof (FIG. 20d). The extensive plasma etching will have reduced the thickness of the original encapsulant so that a substantial thickness of new encapsulant material is provided over all chips. After planarization of the encapsulant as described in the encapsulation section, the process proceeds in exactly the same way as if creating a new module. Because the encapsulant material is thinned and then built up to the same original thickness, the process of repair can be repeated a large number of times. Also, all other chips which are not replaced are completely protected by the encapsulant during the entire process. The prior metallization is cleaned off of the chip pad with no damage to the chip pad itself and a new clean metallization is applied to connect to all chip pads thus making this process extremely reliable.

Figure 21A:
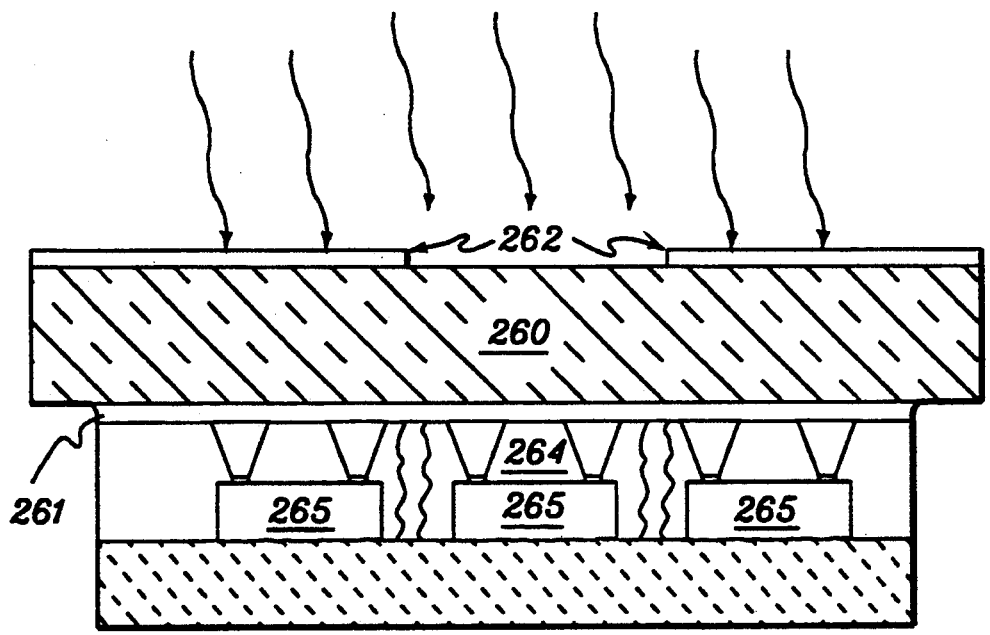
FIG. 21a is a cross-sectional elevational view of a chip removal apparatus pursuant to the present invention, shown in a first operative position.
Figure 21B:
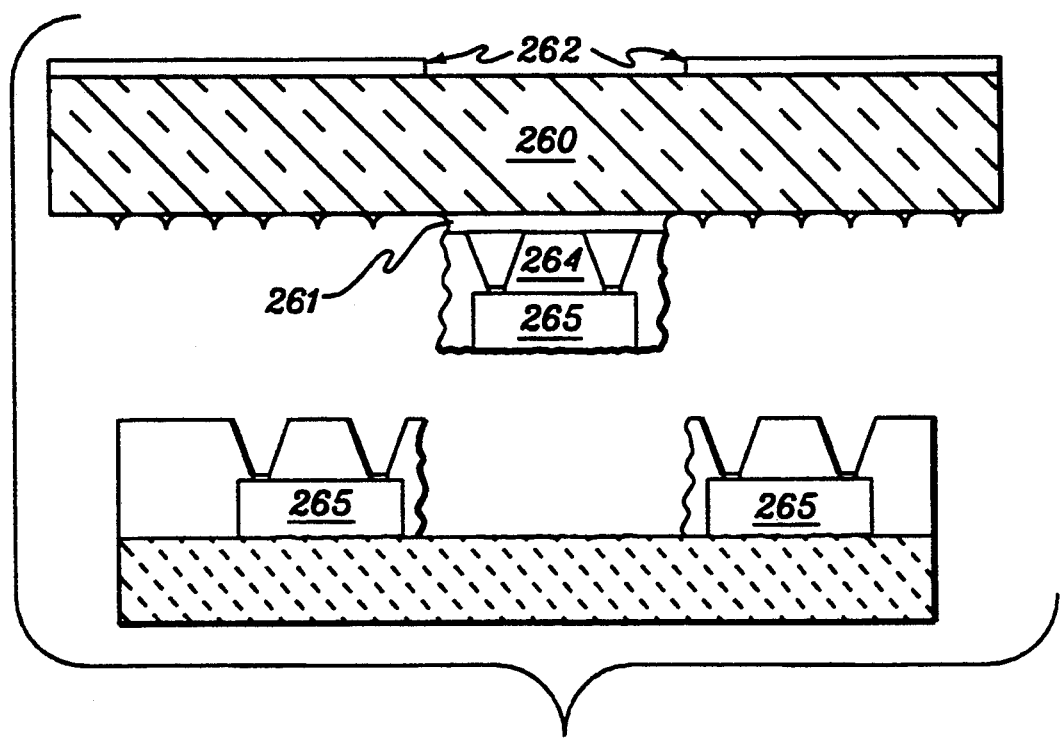
FIG. 21b is a cross-sectional elevational view of the chip removal apparatus of FIG. 21a, shown in a second operative position.

Conventional methods for removing chips involved using specially shaped tweezers to slide under the base of the chip and pull it out. An especially novel approach to removing chips is described below with reference to FIGS. 21a and 21b. After the encapsulant has been cut away and the chip is ready for removal, a glass plate 260 which has been coated with a high temperature UV curable adhesive 261 is placed over the tops of all the encapsulated chips. UV curable material 261 is now exposed through the glass plate in a selective manner by scanning a small aperture 262 over just the section of the glass plate that overlies the chip to be removed. This cures the UV curable material 261 both to the glass plate 260 and to the top surface of the encapsulant 264 connected to the chip 265. The substrate is heated to the softening point of the die attache material. By lifting the glass plate vertically all chips cured to the glass plate are removed at the same time. This technique is especially effective for removing tightly spaced chips and especially effective for removing very small chips which are difficult to selectively remove. The technique is also of value because it can be completely automated wherein selection of chips to be removed and selective application of hardening can all be done under computer control. When the chips have been removed the uncured UV curable resin can be washed away with acetone solvent. Table 3 shows a formulation for the UV curable chip removal adhesive.

TABLE 3

| 75 gm ZTI 1004 | Zeon Technology, Nashua, N.H. |
| 25 gm ECN1229 | |

Note that if the encapsulant material does not adhere sufficiently well to the tops of the chips, it can be removed from the tops of the chips by scanning an aperature of the excimer laser over the tops of the chips to be removed, thus ablating the encapsulant material, and then performing the process described in this paragraph.

Hermetic Structures And Methods

In this section two structures will be disclosed which are based on the basic advanced multichip module invention. These structures achieve common objectives of providing optimal electrical interface on one side of the module and optimal thermal interface on the other. In addition, the structures provided are hermetically sealed. Prior art methods of providing hermetically sealed multichip modules have always involved fabricating a module, placing that module in a second package and then subsequently bonding from the pins of the package to the pads of the multichip module. Finally, a cover is placed on the hermetic package and sealed in place. In order to provide high pin count in a large package the package is necessarily complex and expensive. Additionally, the package increases substantially the total size of the assembly, i.e., over the size of the multichip module itself. This invention is a step forward in that it achieves the hermetic enclosure within essentially the same footprint as the multichip module. It also does this with a very simple structure which has high thermal and electrical performance.

Figure 22:
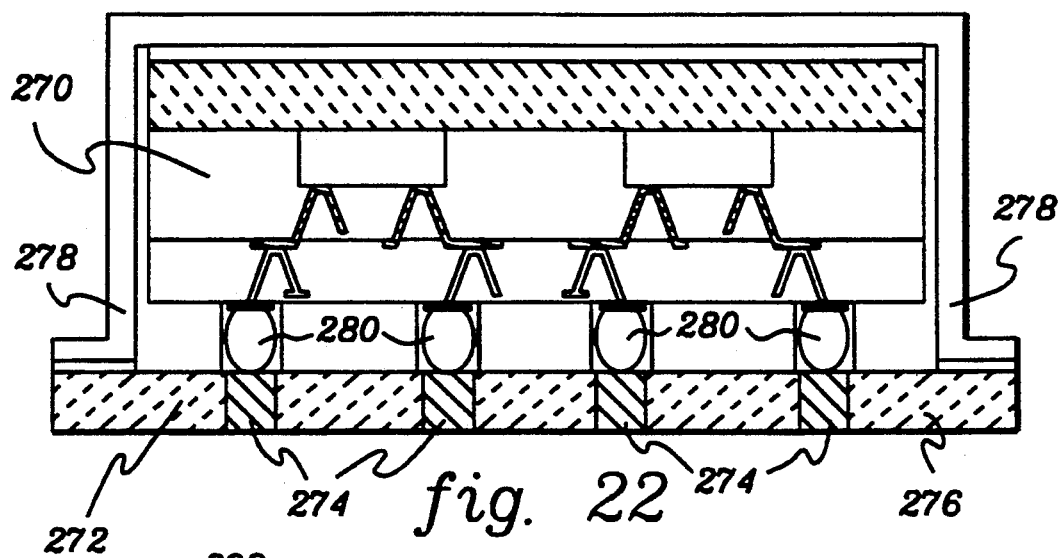
FIG. 22 is a cross-sectional elevational view of one embodiment of a hermetically sealed AMCM structure pursuant to the present invention.

A first embodiment of the invention is shown in FIG. 22. This structure consists of two major sections. These are multichip module with area array pads 270 and hermetic sealing assembly 272 with hermetically sealed input/output conductors. Processing of the multichip module with area array pads proceeds exactly as described above in the area array input output section. The only additional step is the use of an exciter laser to ablate polymer material along the periphery of the substrate base so that proper hermetic sealing can occur. The second part of the structure is the hermetic sealing assembly 272 with hermetic input output conductors 274. This assembly consists of a ceramic I/O lid 276. This lid 276 has input output feed through that are hermetically sealed. In addition the lid has a hermetic sealing ring 278 attached to its periphery. A ceramic lid as described can be obtained from Ceramic Process Systems of Massachusetts. This corporation specializes in forming holes in ceramic, and filling those holes with hermetic plugs which are electrically conductive. They also will provide a hermetic sealing ring in a variety of materials attached to the basic flat ceramic structure with conductive plugs. Before assembling the device, the ceramic input output lid is processed to provide gold pads on both sides of the substrate. This improves the reliability of the final assembled structure. The gold pads are provided as follows.

First, metal is sputtered on both sides of the lid. This is done by sputtring 1,000 angstroms of titanium followed by 3,000 angstroms of copper. Second, F360 photo resist is spun on the hermetic seal ring side of the ceramic lid. A spin speed of 1,500 rpm and spin period of twenty seconds can be used. The resist is then dried on a hot plate for twelve minutes at 95° C. At this point, resist is spun on the other side of the substrate using the same conditions. Although not critical to the operation, initially spinning on the sealing ring side allows the seal ring to prevent contamination of the resist when baking the other side. Using an off contact collimated light source mask liner, such as HTGL/S64D-5X, the resist can be exposed with an energy of 100 mjoules per square centimeter. After exposure of both sides, the resist is developed in 1% sodium carbonate for a period of one minute with continuous agitation. Copper is then electroplated in a two sided apparatus such that a final thickness of the copper plate is approximately 1 mil. This is followed by nickel electroplating. After thorough rinsing the nickel is overplated with 50 micro inches of hard gold using the a gold plate bath available from Transene. After gold plating, the resist is removed by one minute dip in 5% ammonium hydroxide. The background copper is etched in a ten to one solution of ferric chloride for a period of twenty seconds and the titanium removed in a twelve to one solution of TFT etch available from Transene Corporation.

The ceramic lid now consists of a flat piece of ceramic with through conductors that have gold plated copper pads on both sides for good electrical contact plus a hermetic seal ring hermetically attached to the periphery of the lid. The assembly is now completed by placing an array of button contacts 280 in the ceramic lid assembly and then placing the advanced multichip module 270 with array pads over the top of the button contacts 280. The final operation involves sealing the seal ring to the base of the advanced multichip module. This can be accomplished in three different ways depending on the substrate base material.

The substrate base could be fabricated of Kovar plated with nickel which is available as the lid material for Kovar cans from either Isotronics or Augat. If the base material is Kovar a weld seal can be implemented just as a lid would be sealed to a Kovar can. In an alternative embodiment the substrate base could be ceramic previously provided with a solder preform as is well known in the packaging art. Such ceramic plates are used as the tops of ceramic packages. They are plated with materials finally ending in gold plate and can then be soldered by reflow solder techniques to a seal ring. Finally, the base material could be copper clad molybdenum in which case solder sealing or weld sealing can be used. It is important to note that the structure which results is only slightly wider than the multichip module, by the width of the seal ring. The resulting structure has good electrical contact through an electrical interface which is less than one tenth inch between the outside pads and the internal integrated circuits. The thermal interface is directly from the backs of the chips through the base plate of the advanced multichip module itself. The final capability which is extremely important in military applications is that this assembled unit can be leak tested by ordinary leak testing means. This is especially important because it means that the quality of the hermetic seal can be checked before and after stress testing and therefore assure a highly reliable final product. It should also be noted that the seal ring 278 is sized so that the assembly provides adequate pressure on the internal button contacts.

The reason that the standard hermetic seal testing techniques can be used is that there is a free volume directly adjacent to all sealed areas inside the hermetic enclosure. It is also well to note that additional posts of the same thickness as the seal ring can be provided on the ceramic I/O lid. These can be either glued, soldered or welded to the base to help distribute forces required to properly compress the button contacts.

Figure 23A:
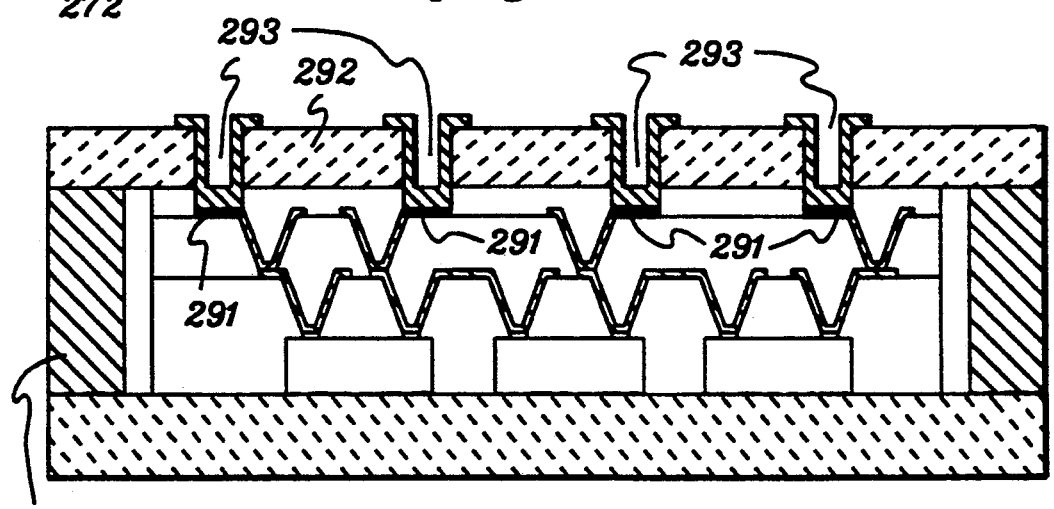
FIG. 23a is a cross-sectional elevational view of another embodiment of a hermetically sealed AMCM structure pursuant to the present invention.
Figure 23B:
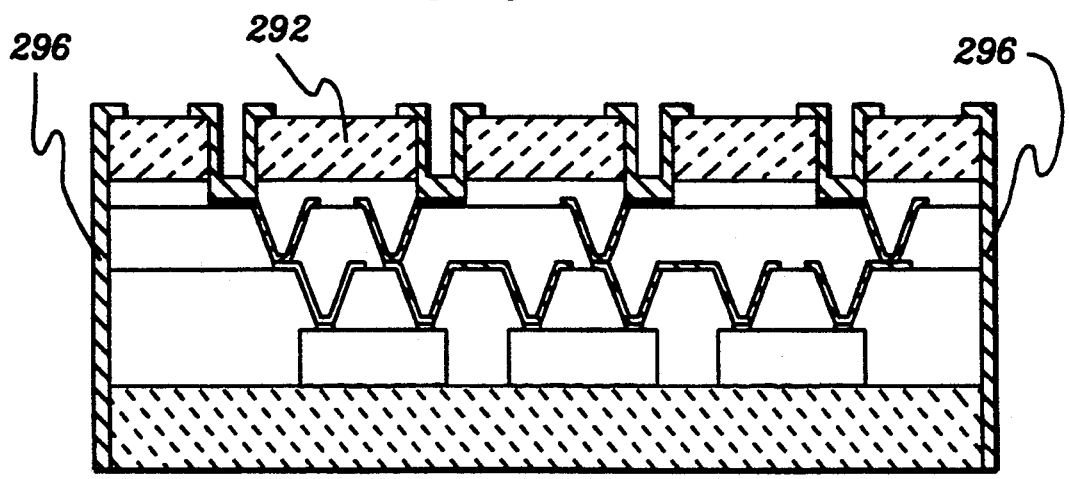

A second novel hermetic structure is disclosed which provides very high output capability through the surface nearest the interconnect and optimized thermal interface to the surface attached directly to the back of the chips. FIGS. 23a and 23b, show the structure. Again the starting point of the structure is the basic advanced multichip module 290 with area array pads. Processing of the basic module proceeds exactly as described in the area array section of this disclosure. The processing departs at the point that copper is electroplated to form thick input output pads 291. In standard processing, nickel followed by gold is used. In this process, a layer of chrome is electroplated instead of nickel gold. This is done to provide adhesion to a subsequent polymer layer which will be applied. The gold is not required because it does not give particularly good adhesion to polymer, and the pad will not be exposed to the elements because it will be hermetically sealed. After plating chrome, the resist is removed and the background metals are etched as described in the area array section of this disclosure. At this time a mixture of ZOL-3A (available from Zeon Technolgies of Nausha, N.H.) and cellosolveacetate mixed 50-50 by weight adhesive is spun on the module at a spin speed of 2,000 rpm for a period of twenty seconds. This adhesive is dried for twenty minutes at 120° C. to thoroughly remove all solvent. Upon cooling to room temperature the adhesive is tack free. An excimer laser is used to ablate both the adhesive and the interlayer dielectric and encapsulant material from the periphery of the substrate so that proper hermetic seal can be made.

The hermetic sealing assembly consists of a ceramic plate 292 in which holes 293 have been drilled and to which a seal ring 294 has been bonded. Methods well known in the art can be used to bond a Kovar sealing ring 294 to ceramic material 292. The ceramic material can be obtained with laser drilled holes from Laser Services Incorporated. At this point, the hermetic sealing assembly with holes is bonded to the top of the multichip module with array pads by using pressure of five pounds per square inch supplied by placing a weight on top of the sealing assembly and placing the assembly on a hot plate at 150° C. This cures the adhesive material but not before the adhesive material flows wetting the entire sealing assembly and partially filling the holes. Once the adhesive bonding has been completed, the assembly is removed from the hot plate. The hermetic seal is completed by welding or soldering the seal ring to the base plate. The polymer in the holes is removed by using an excimer laser which now provides a clean hole down to the pads in the area array of pads in the multichip module. The assembly is placed in a sputtering chamber and 1,000 angstroms of titanium followed by two microns of copper, are sputtered. The extra copper is sputtered in order to give good coverage of copper inside the hole. The assembly is removed from the sputtering chamber. Additional copper is built up by electroplating until a thickness of copper exceeding 1.5 mils is obtained. This effectively seals all of the holes in the system. Nickel is then built up to a thickness of 100 microinches. At this point resist is applied using F360 resist spun at a spin speed of 1,500 rpm. After drying the resist it is exposed with 100 mjoules per square centimeter. Exposure opens the holes and provides large pads directly adjacent to the holes for electrical connections. Gold is then plated to a thickness of greater than 50 microinches. At this point the resist is removed in 5% ammonium hydroxide. The nickel and copper can be etched in ferric chloride using the gold as an etch resist. Once the nickel and copper have been removed the titanium is removed in TFT etch.

In an alternative embodiment, no seal ring is used. Instead when the hermetic sealing assembly without seal ring is pressed on to the adhesive polymer area the thickness of the chips plus the interconnect is exposed around the periphery of the substrate. During the sputtering and subsequent metal plating operations this area 296 is built up with titanium, copper, nickel and gold. This gives a seal around the periphery of the module at the same time that the holes are being sealed. The disclosed structure has some very interesting features in that both the hermetic sealing assembly and the base plate can be relatively thin because they do not need to support forces normally associated with large hermetic cans. That is, the inside of the hermetic enclosure is filled completely with polymer so that any force will be distributed by the polymer. This allows pressurization or forces used for contacting the module to be amortized over the entire area. As a result, a very high density of holes can be provided in the hermetic sealing assembly for input output and a very thin base plate can be provided to give extremely low thermal drop from the chips to the base plate. In addition, although the structure is hermetic it is extremely thin and, especially in the case of the sealing ring formed at the same time as the holes, the assembly is no larger than the original multichip module.

While the invention has been described in detail herein in accordance with certain preferred embodiments thereof, many modifications and changes therein may be affected by those skilled in the art. Accordingly, it is intended by the appended claims to cover all such modifications and changes as fall within the true spirit and scope of the invention.

What is claimed is:

1. A multichip integrated circuit package comprising:
   a substrate having a flat upper surface;
   a plurality of unpackaged integrated circuit chips disposed above said substrate's flat upper surface, said integrated circuit chips each being spaced apart from the other of said integrated circuit chips and each having at least one interconnection pad on a top surface thereof, the top surfaces of said integrated circuit chips being in a plane substantially parallel to said substrate's flat upper surface, said integrated circuit chips also each having at least one side surface;
   an encapsulant surrounding said integrated circuit chips including said top surfaces and said at least one side surfaces thereof and completely filling all space between adjacent integrated circuit chips disposed above said substrate's flat upper surface, said encapsulant having an upper surface above the tops of the integrated circuit chips and having a plurality of via openings therein, said openings being aligned with at least some of said interconnection pads; and
   a pattern of interconnection conductors disposed within at least some of said plurality of via openings and above the upper surface of said encapsulant so as to extend between said at least some of said plurality of via openings, and so as to provide direct electrical connection to at least some of said interconnection pads through said openings, wherein a unitary package of multiple directly interconnected integrated circuit chips is produced.

2. The integrated circuit package of claim 1, wherein said encapsulant comprises a polymer.

3. The integrated circuit package of claim 2, wherein said encapsulant is selected from the group consisting of thermoplastic and thermoset materials.

4. The integrated circuit package of claim 1, wherein the substrate comprises material selected from the group consisting of glass, metal, ceramic, plastic, silicon and composites.

5. The integrated circuit package of claim 1, wherein the substrate comprises alumina.

6. The integrated circuit package of claim 1, further including:
   a dielectric layer overlying said encapsulant and said interconnection conductors, said dielectric layer also including a plurality of via openings therein aligned with at least some of said interconnection conductors disposed on said encapsulant; and
   a second plurality of interconnection conductors disposed above said dielectric layer and extending between at least some of the openings in said dielectric layer so as to provide electrical connection with interconnection pattern conductors disposed above said encapsulant.

7. The integrated circuit package of claim 6, wherein said dielectric layer, together with said second plurality of interconnection conductors, is removable.

8. The integrated circuit package of claim 7, wherein said dielectric layer comprises a solvent-sensitive layer.

9. The integrated circuit package of claim 1, further including:
   a solvent-sensitive layer overlying said encapsulant and said interconnection conductors;
   a dielectric layer overlying said solvent-sensitive layer, said dielectric layer and said solvent-sensitive layer including a plurality of via openings therein aligned with at least some of said interconnection pattern conductors disposed on said encapsulant; and
   a second plurality of interconnection conductors disposed above said dielectric layer and extending between at least some of the openings in said dielectric layer so as to provide electrical connection with interconnection pattern conductors disposed on said encapsulant.

10. The integrated circuit package of claim 1, further comprising:
    at least one preprocessed chip disposed on said substrate's flat upper surface; and wherein:
    said encapsulant overlies said preprocessed chip, said encapsulant having a via opening therein to the upper surface of said preprocessed chip; and
    said pattern of interconnection conductors is disposed above the upper surface of said encapsulant so as to extend between at least some of said via openings, including said opening over the upper surface of said preprocessed chip, so as to provide electrical connection to at least some of said integrated circuit chips and said preprocessed chip.

11. The integrated circuit package of claim 10, wherein said preprocessed chip is positioned near an edge of said multichip package and comprises an input output circuit.

12. The integrated circuit package of claim 10, wherein said preprocessed chip includes a series of conductive lands on a top surface thereof for wire bonding thereto, and wherein said encapsulant overlies only a portion of the top surface of said preprocessed chip and a portion of said conductive lands located thereon, said encapsulant having a via opening therein over at least one of said series of conductive lands, said pattern of interconnection conductors being disposed above the upper surface of said encapsulant so as to extend between at least some of said via openings, including said via opening over said at least one land of said preprocessed chip, to provide electrical connection to at least some of said plurality of integrated circuit chips and said preprocessed chip.

13. The integrated circuit package of claim 10, wherein said preprocessed chip comprises a tiered power and ground bussing structure, said bussing structure including a power strip and a ground strip, and wherein said encapsulant overlies said power and ground bussing structure and has at least one via opening therein to each of said power and ground strips, said pattern of interconnection conductors being disposed above the upper surface of said encapsulant so as to provide electrical connection between said power and ground strips of said preprocessed chip and at least some of said integrated circuit chips.

14. The integrated circuit package of claim 10, wherein said preprocessed chip comprises a termination resistor, said resistor having pads on the upper surface thereof, and wherein said encapsulant's via openings and said pattern of interconnection conductors are disposed to provide electrical connection to said termination resistor and at least some of said integrated circuit chips.

15. The integrated circuit package of claim 10, wherein an adhesive layer is disposed on said substrate's flat upper surface between said plurality of integrated circuit chips and said substrate.

16. The integrated circuit package of claim 1, wherein an adhesive layer is disposed on said substrate's flat upper surface between said plurality of integrated circuit chips and said substrate, and further comprising a termination resistor array, said resistor array being disposed between said substrate and said adhesive layer, and wherein said adhesive layer has via openings therein aligned with selected ones of said plurality of via openings in said encapsulant and with selected electrical contact points in said termination resistor array.

17. The integrated circuit package of claim 16, wherein each termination resistor array is positioned below one of said plurality of integrated circuit chips.

18. The integrated circuit package of claim 1, further comprising an array of electrical contact pads on an upper surface of said package, said array of contact pads being electrically coupled via at least one level of interconnection conductors to at least some of said integrated circuit interconnection pads.

19. The integrated circuit package of claim 18, wherein said array of electrical contact pads on the upper surface of said package provide electrical interface to circuitry external to said package, and wherein said substrate has a lower surface, said lower substrate surface providing a thermal interface for dissipation of heat generated by said integrated circuit chips.

20. The integrated circuit package of claim 19, wherein said substrate's lower surface comprises a lower surface of said integrated circuit package.

21. The integrated circuit package of claim 1, wherein said upper surface of said encapsulant is flat and approximately 1-2 mils from the top surface of said integrated circuit chips.

22. The integrated circuit package of claim 1, wherein a thin continuous adhesive film is disposed on said substrate's flat upper surface between said plurality of integrated circuit chips and said substrate.

23. The integrated circuit package of claim 1, wherein said plurality of integrated circuit chips each have a predetermined thickness, said predetermined thickness being in the range of 4 mils to 8 mils.

24. The integrated circuit package of claim 18, wherein said array of electrical contact pads on the upper surface of said package substantially covers said package's upper surface, at least some of said array of contact pads being disposed over other than said plurality of integrated circuit chips.

25. The integrated circuit package of claim 1, further comprising:
a signal plane disposed above the top surfaces of said plurality of integrated circuit chips; and
a substantially uninterrupted conductive plane also disposed above the top surfaces of said integrated circuit chips, said substantially uninterrupted conductive plane being substantially parallel to said signal plane.

26. The integrated circuit package of claim 25, further comprising:
at least one termination resistor disposed on the upper surface of said substrate; and
connection means for coupling said signal plane to said at least one termination resistor.

27. The integrated circuit package of claim 1, wherein at least two substantially uninterrupted conductive planes are disposed above the top surfaces of said integrated circuit chips, each of said conductive planes being substantially parallel to said signal plane.

28. The integrated circuit package of claim 27, wherein one of said conductive planes comprises a ground plane and one of said conductive planes comprises a power plane.

29. The integrated circuit package of claim 28, wherein each chip of said plurality of integrated circuit chips has a predetermined thickness, said predetermined thickness being in the range of 4 mils to 8 mils.

30. The integrated circuit package of claim 28, wherein said ground plane is disposed between said signal plane and the top surfaces of said integrated circuit chips.

31. The integrated circuit package of claim 28, wherein said ground plane and said power plane are disposed in close, parallel opposing relation to each other, and further comprising a dielectric material disposed between said power plane and said conductive plane.

32. The integrated circuit package of claim 31, wherein said signal plane is spaced a distance y from the top surfaces of said integrated circuit chips and wherein said power plane is spaced a distance x from said ground plane, distance y being greater than distance x.

33. Multichip integrated circuit package comprising:
a circuit component, said component having an upper surface with at least one interconnection pad thereon;
a substrate having an upper surface and a lower surface, said substrate including a hole therein extending from said upper substrate surface to said lower substrate surface, said substrate hole being sized to accommodate said circuit component therein;
at least one integrated circuit chip disposed above said substrate's upper surface, said integrated circuit chip having at least one interconnection pad on a top surface thereof, the top surface of said at least one integrated circuit chip being in a plane substantially parallel to said substrate's upper surface, said integrated circuit chip also having at least one side surface;
said component being positioned within said substrate hole such that said component's upper surface is substantially parallel to said substrate's upper surface;

an encapsulant surrounding said at least one integrated circuit chip including said top surface and said at least one side surface thereof, and contacting at least the upper surface of said circuit component, said encapsulant having an upper surface above the tops of the integrated circuit chip and the circuit component and having a plurality of via openings therein, said openings being aligned with at least some of said chip and component interconnection pads; and a pattern of interconnection conductors disposed above the upper surface of said encapsulant so as to extend between at least some of said openings and so as to provide electrical connection to at least some of said interconnection pads through said openings.

34. The integrated circuit package of claim 33, wherein a plurality of integrated circuit chips are disposed on said substrate's upper surface, each of said circuit chips having at least one interconnection pad on the top surface thereof.

35. The integrated circuit package of claim 34, wherein said substrate upper surface is flat.

36. The integrated circuit package of claim 34, wherein the top surfaces of said integrated circuit chips and the upper surface of said circuit component are substantially coplanar, said plane being parallel to the upper surface of said substrate.

37. The integrated circuit package of claim 36, further comprising means for securing said circuit component within said substrate hole such that the upper surface of said circuit component remains substantially in the same plane as the top surfaces of said integrated circuit chips.

38. The integrated circuit package of claim 34, wherein multiple substrate holes are provided, each of said through holes being sized to accommodate one of a plurality of circuit components.

39. The integrated circuit package of claim 34, wherein said substrate has a lower surface, and said package further comprises a well within said substrate disposed on said substrate's lower surface, said well being sized to accommodate a circuit component such that said component resides within said substrate well, said circuit component being electrically coupled to the upper surface of said substrate by metallized through holes extending through said substrate from said well to said upper substrate surface.

40. The hermetically packaged module of claim 39, wherein said multichip module has at least one side surface and wherein said sealing ring is attached to said at least one module side surface.

41. The hermetically packaged module of claim 40, wherein said lid's cover plate is ceramic.

42. The hermetically packaged module of claim 41, wherein said conductive means comprises a metallization extending through said cover plate openings.

43. The hermetically packaged module of claim 42, wherein said lid cover plate includes gold pads on each side thereof, each of said gold pads contacting one of said metallized cover plate openings.

44. A multichip integrated circuit package comprising:
a substrate having an upper surface and a lower surface, said substrate having a well disposed on the lower surface thereof, said well being sized to accommodate a circuit component such that said component resides entirely within said substrate well;

at least one integrated circuit chip disposed above said substrate's upper surface, said integrated circuit chip having at least one interconnection pad on a top surface thereof, the top surface of said at least one integrated circuit chip being in a plane substantially parallel to said substrate's upper surface, said integrated circuit chip also having at least one side surface;

means for electrically coupling a circuit component disposed within said substrate well with the upper surface of said substrate;

an encapsulant surrounding said at least one integrated circuit chip including said top surface and said at least one side surface thereof, and the upper surface of said substrate, said encapsulant having an upper surface above the top of said integrated circuit chip and having a plurality of via openings therein, said openings being aligned with at least some of said chip interconnection pads and said electrical means for coupling said circuit component disposed within said well to the upper surface of said substrate; and a pattern of interconnection conductors disposed above the upper surface of said encapsulant so as to extend between at least some of said openings and so as to provide electrical connection through said openings to at least some of said interconnection pads and said circuit component disposed within said well.

45. The integrated circuit package of claim 44, wherein said electrical coupling means comprises at least two metallized through holes extending through said substrate from said well to said upper substrate surface.

46. The integrated circuit package of claim 44, wherein a plurality of integrated circuit chips are disposed on said substrate's upper surface, each of said circuit chips having at least one interconnection pad on the top surface thereof.

47. The integrated circuit package of claim 46, wherein said substrate's upper surface is flat.

48. A hermetically packaged multichip integrated circuit module comprising:
a multichip module including:
a substrate having an upper surface;
a plurality of unpackaged integrated circuit chips disposed above said substrate's upper surface, said integrated circuit chips each being spaced apart from the other of said integrated circuit chips and each having at least one interconnection pad on a top surface thereof, the top surfaces of said integrated circuit chips being in a plane substantially parallel to said substrate's upper surface, said integrated circuit chips also each having at least one side surface;
an encapsulant surrounding said integrated circuit chips including said top surfaces and said at least one side surfaces thereof and completely filling all space between adjacent integrated circuit chips disposed above said substrate's upper surface, said encapsulant having an upper surface above the tops of the integrated circuit chips and having a plurality of via openings therein, said openings being aligned with at least some of said interconnection pads; and a pattern of interconnection conductors disposed within at least some of said plurality of via openings and above the upper surface of said encapsulant so as to extend between said at least some of said plurality of via openings, and so as to provide direct electrical connection to at least some of said interconnection pads through said openings wherein a unitary module having multiple directly interconnected integrated circuit chip is produced, said pattern of interconnection conductors including at least one connection pad;

a lid including an electrically insulating cover plate having a plurality of openings therethrough;

conductive plugs hermetically disposed within said cover plate openings;

means for electrically connecting at least one of said conductive plugs of said cover plate with at least one of said connection pads of said pattern of interconnection conductors; and means for hermetically sealing said lid about said single multichip module with said at least one conductive plug in electrical contact with said at least one connection pad of said pattern of interconnection conductors.

49. The hermetically packaged module of claim 48, wherein said means for electrically connecting said at least one conductive plug with said at least one connection pad of said pattern of interconnection conductors comprises an array of button contacts disposed between said cover plate and the upper surface of said multichip module.

50. A hermetically packaged multichip integrated circuit module comprising:

a multichip module including:

a substrate having an upper surface;

a plurality of unpackaged integrated circuit chips disposed above said substrate's upper surface, said integrated circuit chips each being spaced apart from the other of said integrated circuit chips and each having at least one interconnection pad on a top surface thereof, the top surfaces of said integrated circuit chips being in a plane substantially parallel to said substrate's upper surface, said integrated circuit chips also each having at least one side surface;

an encapsulant surrounding said integrated circuit chips including said top surfaces and said at least one side surfaces thereof and completely filling all space between adjacent integrated circuit chips disposed above said substrate's upper surface, said encapsulant having an upper surface above the tops of the integrated circuit chips and having a plurality of via openings therein, said openings being aligned with at least some of said interconnection pads; and a pattern of interconnection conductors disposed within at least some of said plurality of via openings and above the upper surface of said encapsulant so as to extend between said at least some of said plurality of via openings and so as to provide direct electrical connection to at least some of said interconnection pads through said openings wherein a unitary module having multiple directly interconnected integrated circuit chips is produced, said pattern of interconnection conductors including at least one connection pad;

a lid including an electrically insulating cover plate having a plurality of openings extending therethrough, said cover plate openings each being aligned with a connection pad on said pattern of interconnection conductors; conductive means hermetically disposed within each of said cover plate openings, at least one of said conductive means being in electrical contact with one of said connection pads of said pattern of interconnection conductors; and means for hermetically sealing said lid about said multichip module with said at least one conductive means in electrical contact with said connection pads of said pattern of interconnection conductors.

51. The hermetically packaged module of claim 50, further including a sealing ring disposed about said module and sealed to said cover plate.

52. The hermetically packaged module of claim 51, wherein a lower surface of said module's substrate is secured to said sealing ring.

53. The hermetically packaged module of claim 51, wherein said module has at least one side surface and wherein said sealing ring is sealed to said at least one module side surface.

54. The hermetically packaged module of claim 50, wherein said module's substrate forms a portion of said hermetic packaging.

* * * * *